(12) United States Patent
Nagami et al.

(10) Patent No.: US 10,250,217 B2
(45) Date of Patent: Apr. 2, 2019

(54) METHOD FOR IMPEDANCE MATCHING OF PLASMA PROCESSING APPARATUS

(71) Applicant: Tokyo Electron Limited, Tokyo (JP)

(72) Inventors: Koichi Nagami, Miyagi (JP); Norikazu Yamada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/790,170

(22) Filed: Oct. 23, 2017

(65) Prior Publication Data
US 2018/0115299 A1   Apr. 26, 2018

(30) Foreign Application Priority Data
Oct. 26, 2016  (JP) ................. 2016-209701

(51) Int. Cl.
*H03H 7/38*       (2006.01)
*H03H 7/40*       (2006.01)

(52) U.S. Cl.
CPC .................. *H03H 7/40* (2013.01)

(58) Field of Classification Search
CPC .................. H03H 7/40; H03H 7/38
USPC ............... 333/17.3, 32; 315/111.21
See application file for complete search history.

(56) References Cited

U.S. PATENT DOCUMENTS 8,710,926 B2 *  4/2014  Nagarkatti ........ H01J 37/32082
                                                    330/254

FOREIGN PATENT DOCUMENTS

| JP | 2009-033080 A | 2/2009 |
| JP | 2009-071292 A | 4/2009 |
| JP | 2012-009544 A | 1/2012 |

* cited by examiner

*Primary Examiner* — Stephen E. Jones
(74) *Attorney, Agent, or Firm* — Pearne & Gordon LLP

(57) ABSTRACT

Each of a first high frequency power supply and a second high frequency power supply of a plasma processing apparatus is configured to selectively output a continuous wave, a modulated wave and a double-modulated wave. A first average value which determines an impedance at a load side of the first high frequency power supply and a second average value which determines an impedance at a load side of the second high frequency power supply are obtained by using any one of two averaging methods depending on a first high frequency power output from the first high frequency power supply and a second high frequency power output from the second high frequency power supply. An impedance matching of each of a first matching device and a second matching device is performed based on the first average value and the second average value.

5 Claims, 22 Drawing Sheets

METHOD FOR IMPEDANCE MATCHING OF PLASMA PROCESSING APPARATUS

CROSS-REFERENCE TO RELATED APPLICATION

This application claims the benefit of Japanese Patent Application No. 2016-209701 filed on Oct. 26, 2016, the entire disclosures of which are incorporated herein by reference.

TECHNICAL FIELD

The embodiments described herein pertain generally to a method for impedance matching of a plasma processing apparatus.

BACKGROUND

In the manufacture of an electronic device such as a semiconductor device, a plasma processing, for example, plasma etching is performed on a processing target object. This plasma processing is performed by using a plasma processing apparatus.

The plasma processing apparatus generally includes a chamber main body, a first electrode, a second electrode, a first high frequency power supply, a first matching device, a second high frequency power supply and a second matching device. The chamber main body provides an internal space therein as a chamber. The first electrode and the second electrode are arranged with a space within the chamber provided therebetween. The second electrode is a lower electrode and is embedded in a mounting table configured to mount a processing target object thereon. The first high frequency power supply is configured to generate a first high frequency power for plasma generation. The first high frequency power is supplied to one of the first electrode and the second electrode. The second high frequency power supply is configured to generate a second high frequency power for ion attraction. The second high frequency power is supplied to the second electrode. In the plasma processing apparatus, a variable reactance element of the first matching device is controlled to match an output impedance of the first high frequency power supply and an impedance at a load side thereof. Further, a variable reactance element of the second matching device is controlled to match an output impedance of the second high frequency power supply and an impedance at a load side thereof. In the plasma processing apparatus, a gas supplied into the chamber is dissociated by a high frequency electric field generated between the first electrode and the second electrode, and the processing target object is processed by active species such as ions and/or radicals.

In the plasma processing apparatus, a high frequency power having a modulated level may be supplied from at least one of the first high frequency power supply and the second high frequency power supply. That is, a modulated wave, whose level is modulated such that a level in one of two alternating periods is lower than a level in the other of the two alternating periods, may be used. A technique of using the high frequency power in the plasma processing apparatus is described in Patent Documents 1 to 3 as follows.

Patent Document 1: Japanese Patent Laid-open Publication No. 2009-071292

Patent Document 2: Japanese Patent Laid-open Publication No. 2009-033080

Patent Document 3: Japanese Patent Laid-open Publication No. 2012-009544

In the plasma processing apparatus, various combinations of the first high frequency power output from the first high frequency power supply and the second high frequency power output from the second high frequency power supply may be considered. By way of example, as a first combination, the first high frequency power is a modulated wave, whereas the second high frequency power is a continuous wave. As a second combination, the first high frequency power is a continuous wave while the second high frequency power is a modulated wave. As a third combination, both the first high frequency power and the second high frequency power are modulated waves. In this third combination, modulation frequencies of the first high frequency power and the second high frequency power may be same or different.

As stated above, if multiple combinations of the first high frequency power and the second high frequency power are selectively used in the single plasma processing apparatus, calculation of an impedance for matching operation of each of the first matching device and the second matching device becomes complicated. Accordingly, with respect to the various combinations of the first high frequency power and the second high frequency power, it is required to achieve a relatively simple calculation of the impedance for the matching operation of each of the first matching device and the second matching device.

SUMMARY

In an exemplary embodiment, there is provided a method for impedance matching of a plasma processing apparatus. The plasma processing apparatus includes a chamber main body, a first electrode and a second electrode, a first high frequency power supply, a second high frequency power supply, a first power feed line, a second power feed line, a first matching device and a second matching device. The first electrode and the second electrode are arranged such that a space within the chamber main body is provided therebetween. The first high frequency power supply is configured to output a first high frequency power for plasma generation. The first high frequency power has a first basic frequency. The second high frequency power supply is configured to output a second high frequency power for ion attraction. The second high frequency power has a second basic frequency lower than the first basic frequency. The first power feed line is configured to electrically connect the first electrode or the second electrode to the first high frequency power supply. The second power feed line is configured to electrically connect the second electrode to the second high frequency power supply. The first matching device is configured to adjust an impedance at a load side of the first high frequency power supply. The second matching device is configured to adjust an impedance at a load side of the second high frequency power supply.

The first high frequency power supply is configured to selectively output, as the first high frequency power, one of a first continuous wave having the first basic frequency, a first modulated wave and a first double-modulated wave. The first modulated wave is generated by modulating a level of a continuous wave having the first basic frequency through a first modulation. In the first modulation, a level of a continuous wave is modulated such that a level in one period between two periods alternately repeated at a modulation frequency is set to be higher than a level in the other period between the two periods. The first double-modulated wave is generated by modulating a level of a continuous wave having the first basic frequency through a second modulation. In the second modulation, a level of a continuous wave is modulated such that a level in a period during which one period between two periods alternately repeated at a first modulation frequency and one period between two periods alternately repeated at a second modulation frequency lower than the first modulation frequency are overlapped is set to be higher than levels in the other period between the two periods alternately repeated at the first modulation frequency and the other period between the two periods alternately repeated at the second modulation frequency. The second high frequency power supply is configured to selectively output, as the second high frequency power, one of a second continuous wave having the second basic frequency; a second modulated wave generated by modulating a level of a continuous wave having the second basic frequency through the first modulation; and a second double-modulated wave generated by modulating a level of a continuous wave having the second basic frequency through the second modulation.

The above-mentioned method includes (i) performing an averaging processing in which a first average value of the impedance at the load side of the first high frequency power supply or a first average value group including an average value of voltages and an average value of currents on the first power feed line is calculated, and a second average value of the impedance at the load side of the second high frequency power supply or a second average value group including an average value of voltages and an average value of currents on the second power feed line is calculated; (ii) calculating a first moving average value and a second moving average value, the first moving average value being a moving average value of the impedance at the load side of the first high frequency power supply and being calculated from a preset number of the first average values or a preset number of the first average value groups obtained by the performing of the averaging processing, and the second moving average value being a moving average value of the impedance at the load side of the second high frequency power supply and being calculated from a preset number of the second average values or a preset number of the second average value groups obtained by the performing of the averaging processing; and (iii) adjusting a variable reactance element of the first matching device and a variable reactance element of the second matching device such that the first moving average value and the second moving average value respectively approximate to matching points.

If a lowest modulation frequency used in generation of the first high frequency power and the second high frequency power is used only in the generation of the high frequency power output from one of the first high frequency power supply and the second high frequency power supply, the first average value and the second average value are obtained by calculating an average value of the impedance at the load side of the one high frequency power supply at multiple time points in the one period between the two periods alternately repeated at the lowest modulation frequency and, also, by calculating an average value of the impedance at the load side of the other high frequency power supply at multiple time points in both of the two periods alternately repeated at the lowest modulation frequency, or the first average value group and the second average value group are obtained by calculating an average value of the currents and an average value of the voltages on one power feed line used for transmission of the high frequency power from the one high frequency power supply between the first power feed line and the second power feed line at multiple time points in the one period between the two periods alternately repeated at the lowest modulation frequency and, also, by calculating an average value of the currents and an average value of the voltages on the other power feed line at multiple time points in both of the two periods alternately repeated at the lowest modulation frequency.

If the lowest modulation frequency used in the generation of the first high frequency power and the second high frequency power is commonly used in the generation of both the first high frequency power and the second high frequency power, the first average value is calculated from the impedance at the load side of the first high frequency power supply at multiple time points in the one period between the two periods within a modulation cycle of the first high frequency power defined by the lowest modulation frequency, and the second average value is calculated from the impedance at the load side of the second high frequency power supply at multiple time points in the one period between the two periods within a modulation cycle of the second high frequency power defined by the lowest modulation frequency, or the first average value group is calculated from the voltage and the current on the first power feed line at multiple times points in the one period between the two periods within the modulation cycle of the first high frequency power defined by the lowest modulation frequency, and the second average value group is calculated from the voltage and the current on the second power feed line at multiple time points in the one period between the two periods within the modulation cycle of the second high frequency power defined by the lowest modulation frequency.

In the method according to the present exemplary embodiment, the first moving average value is calculated from a preset number of the first average values or a preset number of the first average value groups, and the second moving average value is calculated from a preset number of the second average values or a preset number of the second average value groups. The variable reactance element of the first matching device is adjusted based on the first moving average value, and the variable reactance element of the second matching device is adjusted based on the second moving average value. In the method, one of the two averaging processings which select different monitoring periods for the calculation of the first average value or the first average value group and the second average value or the second average value group is selectively performed depending on whether or not the lowest modulation frequency used in the generation of the first high frequency power and the second high frequency power is commonly used in the generation of both the first high frequency power and the second high frequency power. That is, the first average value or the first average value group and the second average value or the second average value group are calculated only by the two averaging processings on the various combinations of the modulation of the first high frequency power and the modulation of the second high frequency power. Therefore, the relatively simple calculation of the impedance for the matching operation of each of the first matching device and the second matching device can be achieved.

If the first high frequency power supply outputs the first modulated wave; the second high frequency power supply outputs the second double-modulated wave; and the modulation frequency used in generation of the first modulated wave and the first modulation frequency used in generation of the second double-modulated wave are same, the first average value is calculated from the average values of the impedance at the load side of the first high frequency power supply in the modulation cycles, each of which is defined by the modulation frequency used in the generation of the first modulated wave, within the modulation cycle defined by the second modulation frequency used in the generation of the second double-modulated wave, or the first average value group is calculated from average values of the currents and average values of the voltages on the first power feed line in the modulation cycles. According to the present exemplary embodiment, the impedance at the load side of the first high frequency power supply obtained by using the first average value or the voltage and the current on the first power feed line obtained by using the first average value group can be calculated with higher accuracy.

If the first high frequency power supply outputs the first double-modulated wave; the second high frequency power supply outputs the second modulated wave which is synchronized with the first double-modulated wave; and the second modulation frequency used in the generation of the first double-modulated wave is the same as the modulation frequency used in the generation of the second modulated wave, the first average value is calculated from average values of the impedance at the load side of the first high frequency power supply in the modulation cycles, each of which is defined by the first modulation frequency used in the generation of the first double-modulated wave, within the modulation cycle defined by the second modulation frequency used in the generation of the first double-modulated wave, or the first average value group is calculated from the average value of the currents and the average value of the voltages on the first power feed line in the modulation cycles. According to the present exemplary embodiment, the impedance at the load side of the first high frequency power supply obtained by using the first average value or the voltage and the current on the first power feed line obtained by using the first average value group can be calculated with higher accuracy.

If the first high frequency power supply outputs the first double-modulated wave; the second high frequency power supply outputs the second modulated wave which is synchronized with the first double-modulated wave; and the second modulation frequency used in the generation of the first double-modulated wave is the same as the modulation frequency used in the generation of the second modulated wave, the first average value is calculated from the impedance at the load side of the first high frequency power supply in a period during which the one period between the two periods within the modulation cycle defined by the second modulation frequency used in the generation of the first double-modulated wave and the one period between the two periods within the corresponding modulation cycle defined by the modulation frequency used in the generation of the second modulated wave are overlapped, or the first average value group is calculated from the voltage and the current on the first power feed line in the period during which the one period between the two periods within the modulation cycle defined by the second modulation frequency used in the generation of the first double-modulated wave and the one period between the two periods within the corresponding modulation cycle defined by the modulation frequency used in the generation of the second modulated wave are overlapped.

The first high frequency power is modulated to have different levels in different periods within the one period between the two periods alternately repeated at the modulation frequency used in the first modulation or within the one period between the two periods alternately repeated at the first modulation frequency used in the second modulation, and the first average value is calculated from the average values of the impedance at the load side of the first high frequency power supply in the different periods, or the first average value group is calculated from the average values of the voltages and the average values of the currents on the first power feed line in the different periods. According to the present exemplary embodiment, even if the level of the first high frequency power is changed in one period between the two periods in the modulation cycle, the impedance at the load side of the first high frequency power supply obtained by using the first average value or the average value of the voltages and the average value of the currents on the first power feed line obtained by using the first average value group can be calculated with higher accuracy.

According to the exemplary embodiment as described above, the relatively simple calculation of the impedance for the matching operation of each of the first matching device and the second matching device can be achieved for various combinations of the first high frequency power and the second high frequency power.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
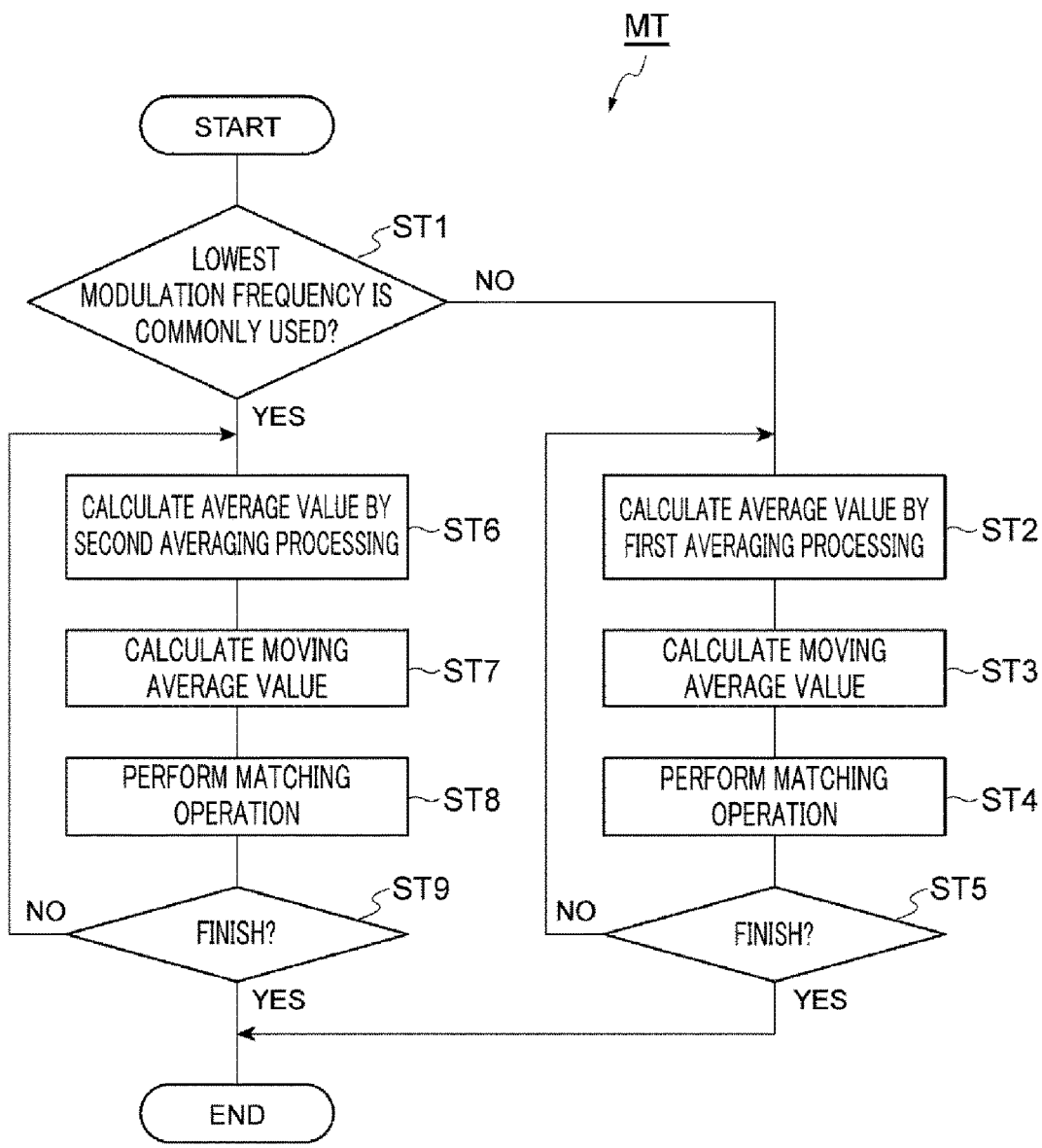
FIG. 1 is flowchart for describing a method for impedance matching of a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments of the present disclosure will be explained in detail with reference to the accompanying drawings. In the drawings, same or corresponding parts will be assigned same reference numerals FIG. 1 is a flowchart for describing a method for impedance matching of a plasma processing apparatus according to an exemplary embodiment. A method MT shown in FIG. 1 is a method for allowing an impedance of a load side of a first high frequency power supply and an impedance of a load side of a second high frequency power supply of the plasma processing apparatus to coincide with or approximate to a matching point.

Figure 2:
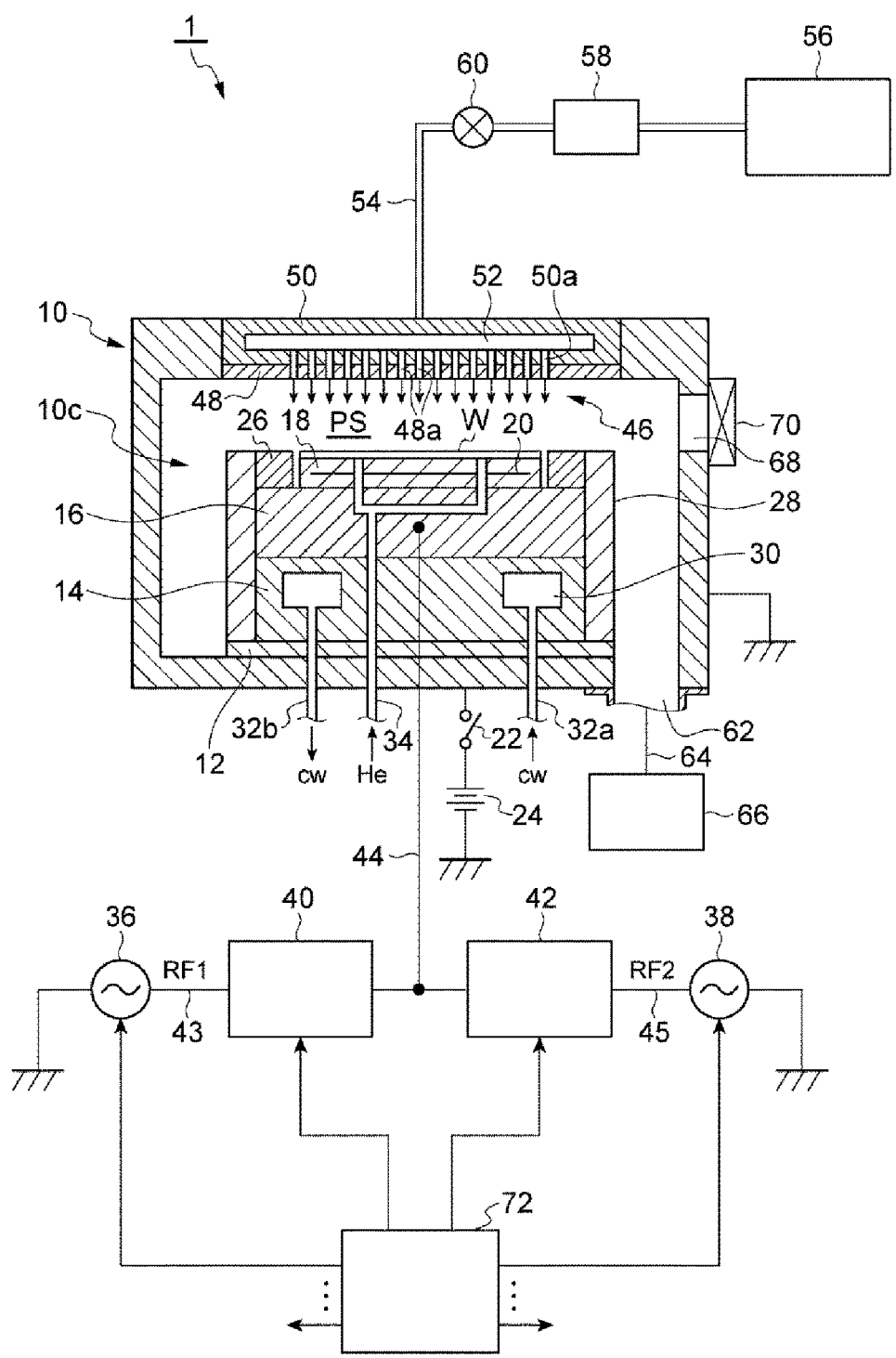
FIG. 2 is a diagram schematically illustrating the plasma processing apparatus according to the exemplary embodiment to which the method of FIG. 1 is applicable.

FIG. 2 is a diagram schematically illustrating the plasma processing apparatus according to the exemplary embodiment to which the method of FIG. 1 is applicable. The plasma processing apparatus 1 shown in FIG. 2 is a capacitively coupled plasma processing apparatus. The plasma processing apparatus 1 includes a chamber main body 10. The chamber main body 10 has a substantially cylindrical shape. The chamber main body 10 provides an internal space therein as a chamber 10c. The chamber main body 10 is made of a material such as aluminum. An inner wall surface of the chamber main body 10 is anodically oxidized. Further, the chamber main body 10 is grounded.

An insulating plate 12 is provided on a bottom portion of the chamber main body 10. The insulating plate 12 is made of, by way of example, but not limitation, ceramic. A supporting table 14 is provided on the insulating plate 12. The supporting table 14 has a substantially cylindrical shape. A susceptor 16 is provided on the supporting table 14. The susceptor 16 is made of a conductive material such as aluminum and is configured as a lower electrode, that is, a second electrode.

An electrostatic chuck 18 is provided on the susceptor 16. The electrostatic chuck 18 has an insulating layer and an electrode 20 embedded in the insulating layer. The electrode 20 of the electrostatic chuck 18 is electrically connected with a DC power supply 24 via a switch 22. The electrostatic chuck 18 is configured to generate an electrostatic attracting force by a DC voltage applied from the DC power supply 24 and hold a processing target object W placed on the electrostatic chuck 18 by the electrostatic attracting force. The processing target object W may have, for example, a substantially disk shape like a wafer. A focus ring 26 is placed on the susceptor 16 to surround the electrostatic chuck 18. Further, a cylindrical inner wall member 28 is mounted to side surfaces of the susceptor 16 and the supporting table 14. This inner wall member 28 is made of, but not limited to, quartz.

A flow path 30 is formed within the supporting table 14. The flow path 30 is extended in, for example, a spiral shape with respect to a central axis line extended in a vertical direction. A coolant cw (for example, cooling water) is supplied into this flow path 30 from a chiller unit provided at an outside of the chamber main body 10 through a pipeline 32a. The coolant cw supplied into the flow path 30 is returned back into the chiller unit through a pipeline 32b. As a temperature of the coolant is adjusted by the chiller unit, a temperature of the processing target object W is also adjusted. Further, in the plasma processing apparatus 1, a heat transfer gas (e.g., a He gas) supplied through a gas supply line 34 is supplied into a gap between a top surface of the electrostatic chuck 18 and a rear surface of the processing target object W.

A conductor 44 (for example, a power feed rod) is connected to the susceptor 16. This conductor 44 is connected to a high frequency power supply 36 (first high frequency power supply) via a matching device 40 (first matching device) and to a high frequency power supply 38 (second high frequency power supply) via a matching device 42 (second matching device). The high frequency power supply 36 is configured to generate a first high frequency power for plasma generation, i.e., a high frequency power RF1. The high frequency power RF1 has a first basic frequency, i.e., a basic frequency $f_{B1}$. The basic frequency $f_{B1}$ is, for example, 100 MHz. The high frequency power supply 38 is configured to output a second high frequency power for ion attraction from plasma into the processing target object W, i.e., a high frequency power RF2. This high frequency power RF2 has a second basic frequency, i.e., a basic frequency $f_{B2}$. The basic frequency $f_{B2}$ is, for example, 13.56 MHz.

The matching device 40 and the conductor 44 constitute a part of a first power feed line configured to transmit the high frequency power RF1 from the high frequency power supply 36 to the susceptor 16, i.e., a power feed line 43. The matching device 42 and the conductor 44 constitute a part of a second power feed line configured to transmit the high frequency power RF2 from the high frequency power supply 38 to the susceptor 16, i.e., a power feed line 45.

A first electrode, i.e., an upper electrode 46 is provided at a ceiling portion of the chamber main body 10. A space PS in which plasma is generated is provided between the upper electrode 46 and the susceptor 16 within the chamber 10c. The upper electrode 46 includes a ceiling plate 48 and a supporting body 50. The ceiling plate 48 is provided with a multiple number of gas discharge holes 48a. The ceiling plate 48 is made of a silicon-based material such as Si or SiC. The supporting body 50 is a member configured to support the ceiling plate 48 in a detachable manner and is made of aluminum having an anodically oxidized surface.

A gas buffer room 52 is formed within the supporting body 50. Further, the supporting body 50 is provided with a multiple number of holes 50a. These holes 50a are extended downwards from the gas buffer room 52 to communicate with the gas discharge holes 48a, respectively. The gas buffer room 52 is connected with one or more gas sources 56 via a gas supply line 54. The one or more gas sources 56 are respectively connected to the gas buffer room 52 via corresponding flow rate controllers among one or more flow rate controllers 58 such as mass flow controllers and corresponding valves among one or more valves 60. A gas from each of the one or more gas sources 56 is introduced into the gas buffer room 52 after its flow rate is adjusted by the corresponding flow rate controller 58. The gas introduced into the gas buffer room 52 is discharged into the space PS from the multiple number of gas discharge holes 48a.

When viewed from the top, an annular space is formed between the susceptor 16 and a sidewall of the chamber main body 10 and between the supporting table 14 and the sidewall of the chamber main body 10. A bottom portion of this space is connected to an exhaust port 62 of the chamber main body 10. An exhaust line 64 communicated with the exhaust port 62 is connected to the bottom portion of the chamber main body 10. The exhaust line 64 is connected to an exhaust device 66. The exhaust device 66 has a pressure controller and a vacuum pump such as a turbo molecular pump. The exhaust device 66 is configured to decompress the chamber 10c. Further, a passageway 68 for carry-in and carry-out of the processing target object W is formed at the sidewall of the chamber main body 10. A gate valve 70 configured to open/close the passageway 68 is provided at the sidewall of the chamber main body 10.

The plasma processing apparatus 1 further includes a main controller 72. The main controller 72 is implemented by, for example, a computer device and includes a processor and a storage device such as a memory. The storage device stores therein software (program) executed by the processor and recipe information. The main controller 72 controls operations of the individual components of the plasma processing apparatus 1 such as the high frequency power supplies 36 and 38, the matching devices 40 and 42, the one or more flow rate controllers 58, the one or more valves 60 and the exhaust device 66 as well as an overall operation of the plasma processing apparatus 1 according to the software and the recipe information.

In a plasma processing performed by the plasma processing apparatus 1, the gate valve 70 is first opened, and the processing target object W is carried into the chamber main body 10 through the passageway 68. The processing target object W carried into the chamber main body 10 is placed on the electrostatic chuck 18. Subsequently, a gas from a gas source selected from the one or more gas sources is introduced into the chamber 10c, and the exhaust device 66 is operated so that the chamber 10c is decompressed. Further, the high frequency power RF1 from the high frequency power supply 36 is supplied to the susceptor 16, and the high frequency power RF2 from the high frequency power supply 38 is supplied to the susceptor 16. In addition, the DC voltage from the DC power supply 24 is applied to the electrode 20 of the electrostatic chuck 18, so that the processing target object W is held by the electrostatic chuck 18. Then, the gas introduced into the chamber main body 10 is excited by a high frequency electric field formed between the susceptor 16 and the upper electrode 46. The processing target object W is processed by radicals and/or ions from the plasma thus generated.

Now, referring to FIG. 3 to FIG. 9, the high frequency power RF1 output from the high frequency power supply 36 and the high frequency power RF2 output from the high frequency power supply 38 will be explained. FIG. 3 to FIG. 9 are diagrams illustrating examples of the first high frequency power and the second high frequency power output in a first to a seventh mode.

Figure 4:
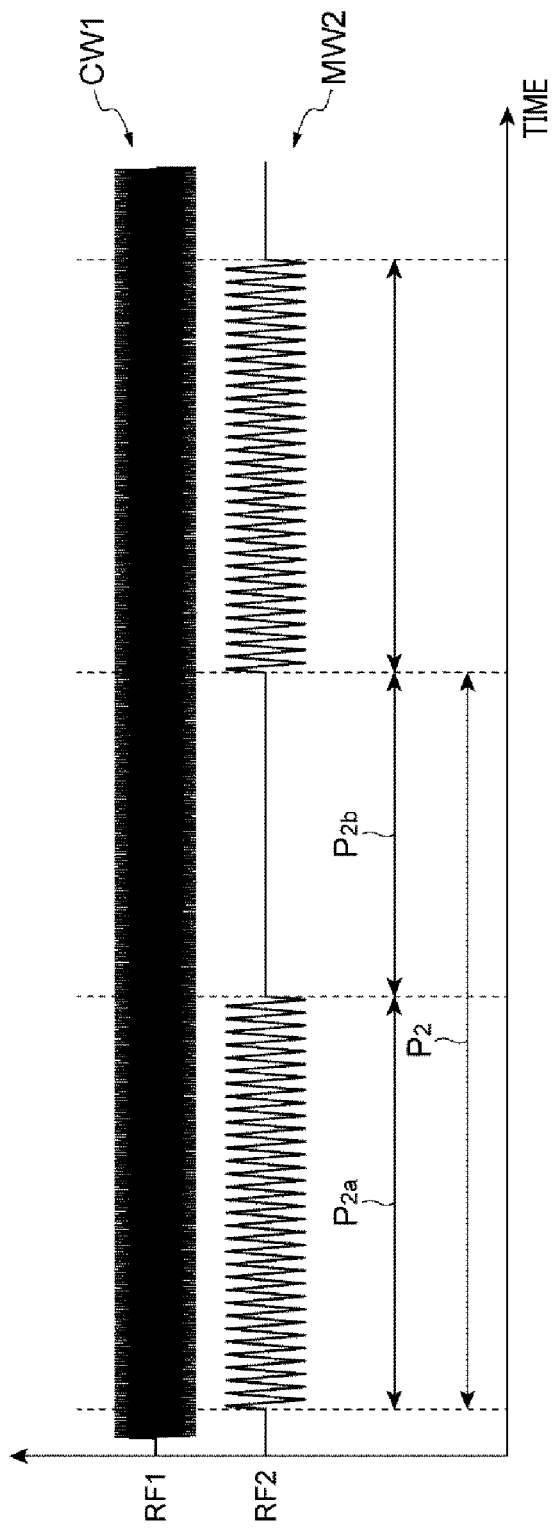
FIG. 4 is a diagram illustrating an example of the first high frequency power and the second high frequency power output in a second mode.

In the plasma processing apparatus 1, the high frequency power supply 36 outputs, as the high frequency power RF1, one of a first continuous wave (continuous wave CW1), a first modulated wave (modulated wave MW1) and a first double-modulated wave (double-modulated wave DW1) selectively. As depicted in FIG. 4, the continuous wave CW1 is a high frequency power having the basic frequency $f_{B1}$ and a continuously constant level (power).

The modulated wave MW1 is generated by modulating a level of a continuous wave having the basic frequency $f_{B1}$ through a first modulation. In the first modulation, the level (power) of the continuous wave is modulated such that a level (power) in one period (hereinafter, sometimes referred to as "high-level period") between two periods alternately repeated at a modulation frequency is higher than a level (power) in the other of the two periods.

As depicted in FIG. 3, FIG. 5, FIG. 6, FIG. 7 and FIG. 8, a level of the modulated wave MW1 in one period $P_{1a}$ between alternately repeated two periods $P_{1a}$ and $P_{1b}$ is higher than a level of the modulated wave MW1 in the other period $P_{1b}$. The level of the modulated wave MW1 in the period $P_{1b}$ may be zero. Further, a modulation frequency $f_{M1}$ of the modulated wave MW1 is a reciprocal of a modulation cycle $P_1$, and the modulation cycle $P_1$ includes the one period $P_{1a}$ and the period $P_{1b}$ continuous with the period $P_{1a}$. The modulation frequency $f_{M1}$ is lower than the basic frequency $f_{B1}$.

The double-modulated wave DW1 is a modulated wave generated by modulating a level of a continuous wave having the basic frequency $f_{B1}$ through a second modulation. In the second modulation, the level (power) of the continuous wave is modulated such that a level (power) in a period during which one period (hereinafter, sometimes referred to as "high-level period") between two periods alternately repeated at a first modulation frequency and one period (hereinafter, sometimes referred to as "high-level period")

between two periods alternately repeated at a second modulation frequency lower than the first modulation frequency are overlapped is higher than a level (power) in the other period between the two periods alternately repeated at the corresponding first modulation frequency and a level (power) in the other period between the two periods alternately repeated at the corresponding second modulation frequency.

Figure 9:
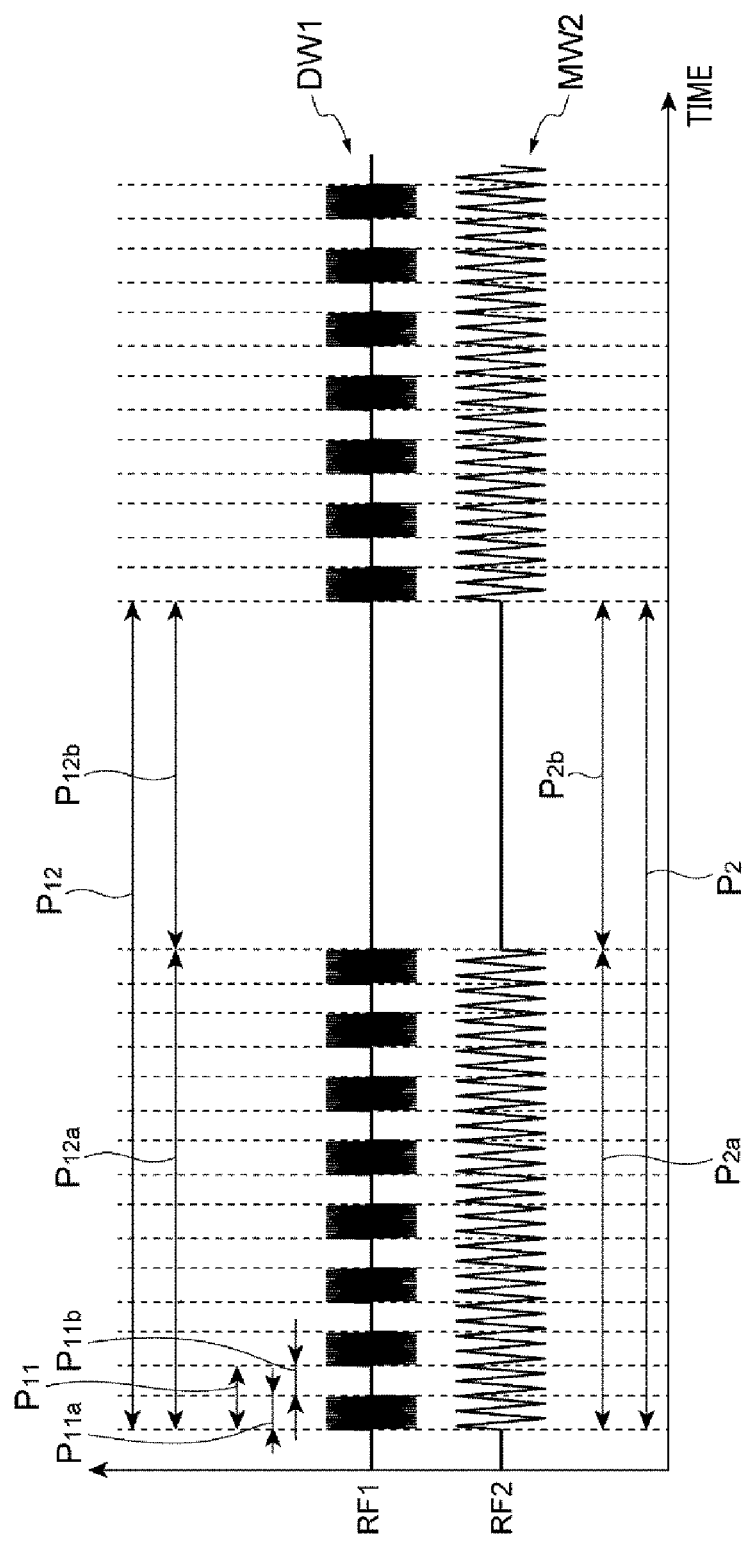
FIG. 9 is a diagram illustrating an example of the first high frequency power and the second high frequency power output in a seventh mode.

As shown in FIG. 9, a level of the double-modulated wave DW1 in a period during which one period $P_{11a}$ between alternately repeated two periods $P_{11a}$ and $P_{11b}$ and one period $P_{12a}$ between alternately repeated two periods $P_{12a}$ and $P_{12b}$ are overlapped is higher than a level of the double-modulated wave DW1 in the period $P_{11b}$ and a level of the double-modulated wave DW1 in the period $P_{12b}$. The levels of the double-modulated wave DW1 in the period $P_{11b}$ and the period $P_{12b}$ may be zero. Further, the first modulation frequency $f_{D11}$ of the double-modulated wave DW1 is a reciprocal of a modulation cycle $P_{11}$, and the modulation cycle $P_{11}$ includes the one period $P_{11a}$ and the period $P_{11b}$ continuous with the period $P_{11a}$. A second modulation frequency $f_{D12}$ of the double-modulated wave DW1 is a reciprocal of a modulation cycle $P_{12}$, and the modulation cycle $P_{12}$ includes the one period $P_{12a}$ and the period $P_{12b}$ continuous with the period $P_{12a}$. The second modulation frequency $f_{D12}$ is lower than the first modulation frequency $f_{D11}$. Further, the first modulation frequency $f_{D11}$ and the second modulation frequency $f_{D12}$ are lower than the basic frequency $f_{B1}$.

Figure 3:
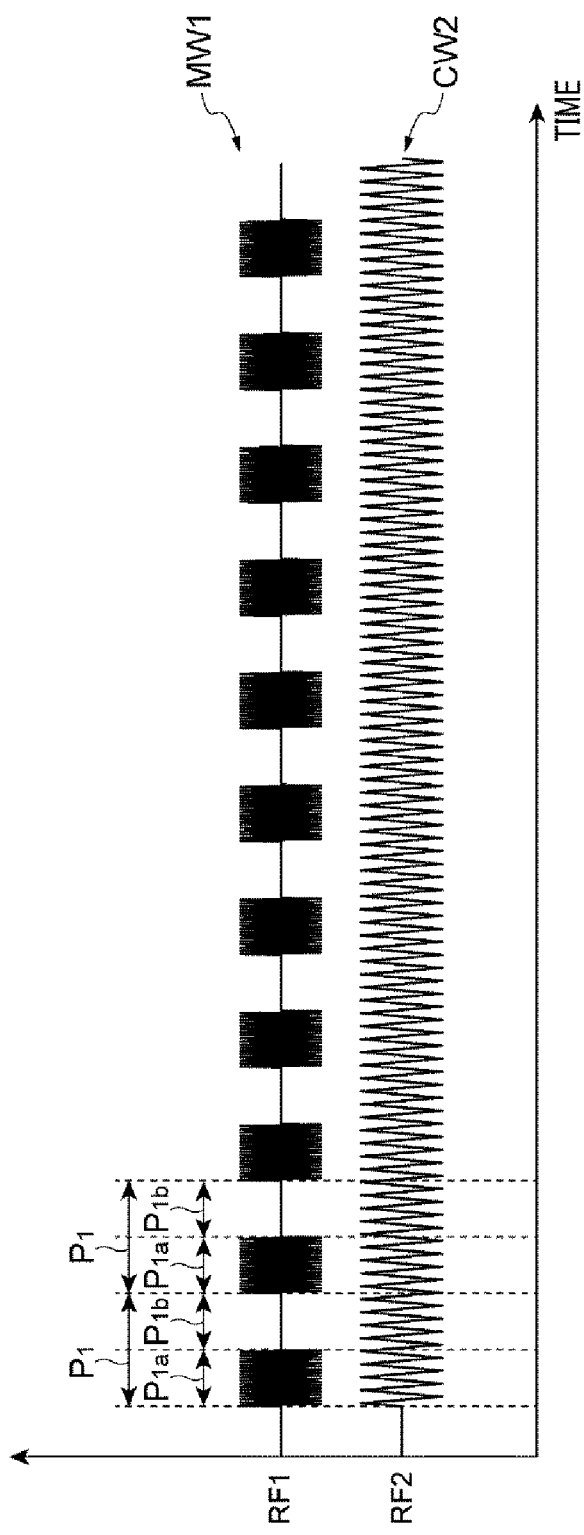
FIG. 3 is a diagram illustrating an example of the first high frequency power and the second high frequency power output in a first mode.

The high frequency power supply 38 outputs, as the high frequency power RF2, one of a second continuous wave (continuous wave CW2), a second modulated wave (modulated wave MW2) and a second double-modulated wave (double-modulated wave DW2) selectively. As depicted in FIG. 3, the continuous wave CW2 has the basic frequency $f_{B2}$.

The modulated wave MW2 is generated by modulating a level of a continuous wave having the basic frequency $f_{B2}$ through the first modulation. As shown in FIG. 4, FIG. 5, FIG. 6, FIG. 7 and FIG. 9, a level of the modulated wave MW2 in one period $P_{2a}$ between alternately repeated two periods $P_{2a}$ and $P_{2b}$ is higher than a level of the modulated wave MW2 in the other period $P_{2b}$. The level of the modulated wave MW2 in the period $P_{2b}$ may be zero. Further, a modulation frequency $f_{M2}$ of the modulated wave MW2 is a reciprocal of a modulation cycle $P_2$, and the modulation cycle $P_2$ includes the one period $P_{2a}$ and the period $P_{2b}$ continuous with the period $P_{2a}$. The modulation frequency $f_{M2}$ is lower than the basic frequency $f_{B2}$.

Figure 8:
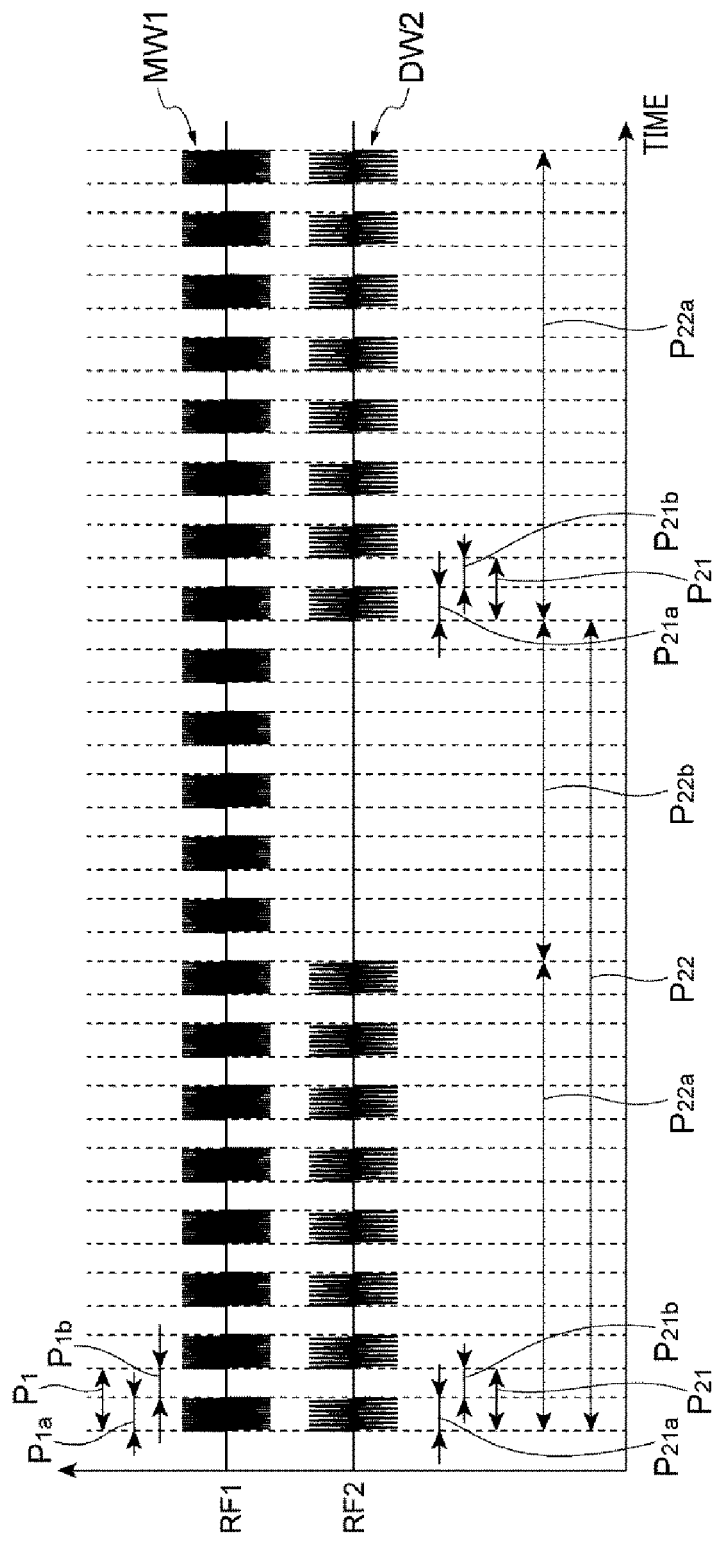
FIG. 8 is a diagram illustrating an example of the first high frequency power and the second high frequency power output in a sixth mode.

The double-modulated wave DW2 is a modulated wave generated by modulating a level of a continuous wave having the basic frequency $f_{B2}$ through the second modulation. As shown in FIG. 8, a level of the double-modulated wave DW2 in a period during which one period $P_{21a}$ between alternately repeated two periods $P_{21a}$ and $P_{21b}$ and one period $P_{22a}$ between alternately repeated two periods $P_{22a}$ and $P_{22b}$ are overlapped is higher than a level of the double-modulated wave DW2 in the period $P_{21b}$ and a level of the double-modulated wave DW2 in the period $P_{22b}$. The levels of the double-modulated wave DW2 in the period $P_{21b}$ and the period $P_{22b}$ may be zero. Further, a first modulation frequency $f_{D21}$ of the double-modulated wave DW2 is a reciprocal of a modulation cycle $P_{21}$, and the modulation cycle $P_{21}$ includes the one period $P_{21a}$ and the period $P_{21b}$ continuous with the period $P_{21a}$. A second modulation frequency $f_{D22}$ of the double-modulated wave DW2 is a reciprocal of a modulation cycle $P_{22}$, and the modulation cycle $P_{22}$ includes the one period $P_{22a}$ and the period $P_{22b}$ continuous with the period $P_{22a}$. The second modulation frequency $f_{D22}$ is lower than the first modulation frequency $f_{D21}$. Further, the first modulation frequency $f_{D21}$ and the second modulation frequency $f_{D22}$ are lower than the basic frequency $f_{B2}$.

As depicted in FIG. 3, in a first mode, the high frequency power supply 36 outputs the modulated wave MW1, and the high frequency power supply 38 outputs the continuous wave CW2. As shown in FIG. 4, in a second mode, the high frequency power supply 36 outputs the continuous wave CW1, and the high frequency power supply 38 outputs the modulated wave MW2.

Figure 5:
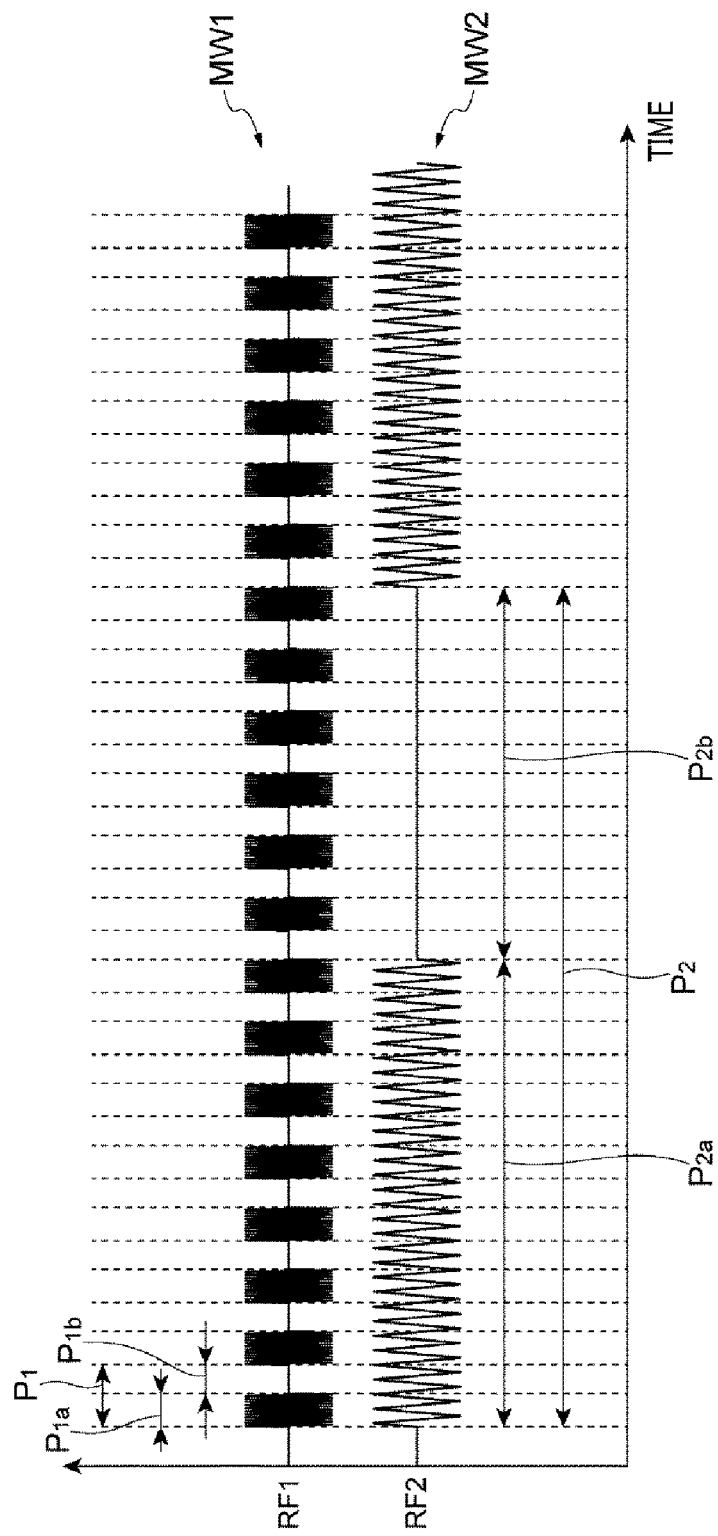
FIG. 5 is a diagram illustrating an example of the first high frequency power and the second high frequency power output in a third mode.

As depicted in FIG. 5, in a third mode, the high frequency power supply 36 outputs the modulated wave MW1, and the high frequency power supply 38 outputs the modulated wave MW2. In the third mode, the modulation frequency $f_{M1}$ is higher than the modulation frequency $f_{M2}$ and may be, for example, equal to or higher than 10 kHz.

Figure 6:
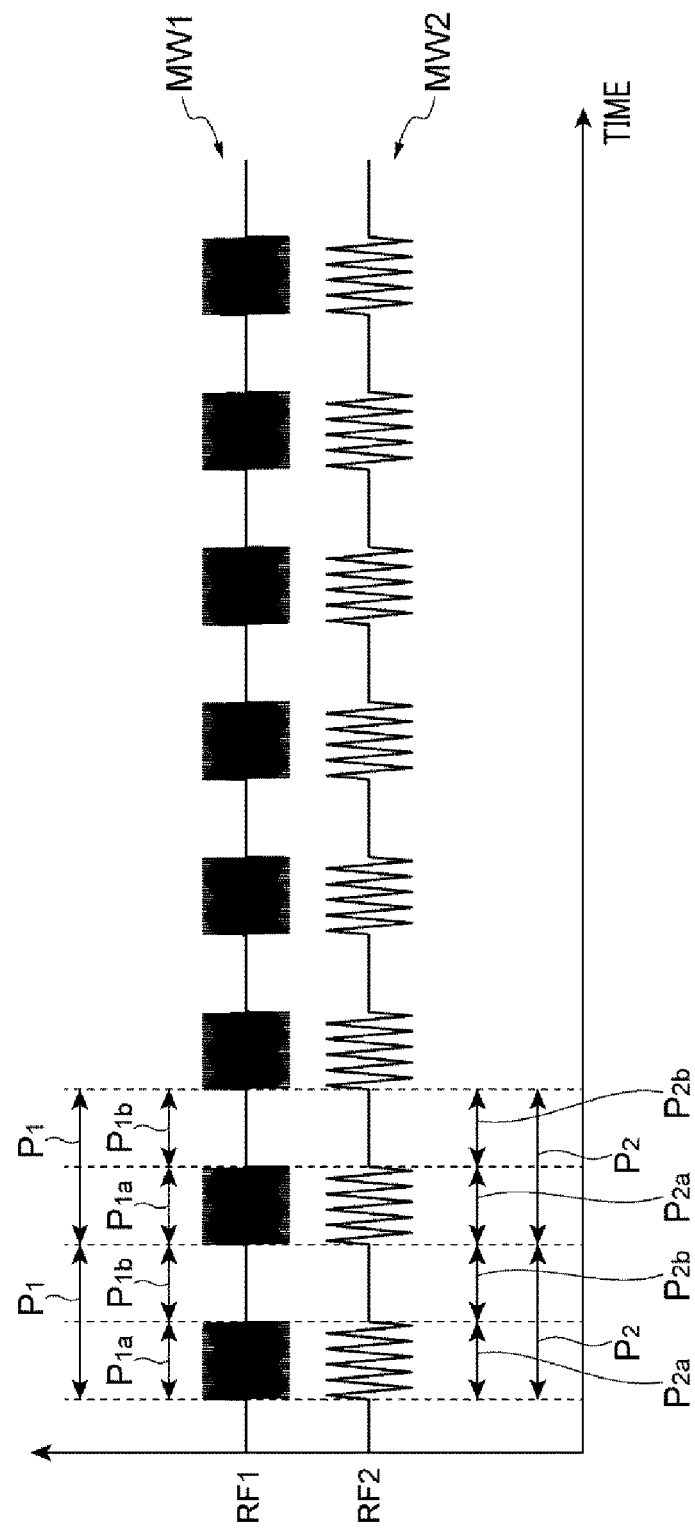
FIG. 6 is a diagram illustrating an example of the first high frequency power and the second high frequency power output in a fourth mode.
Figure 7:
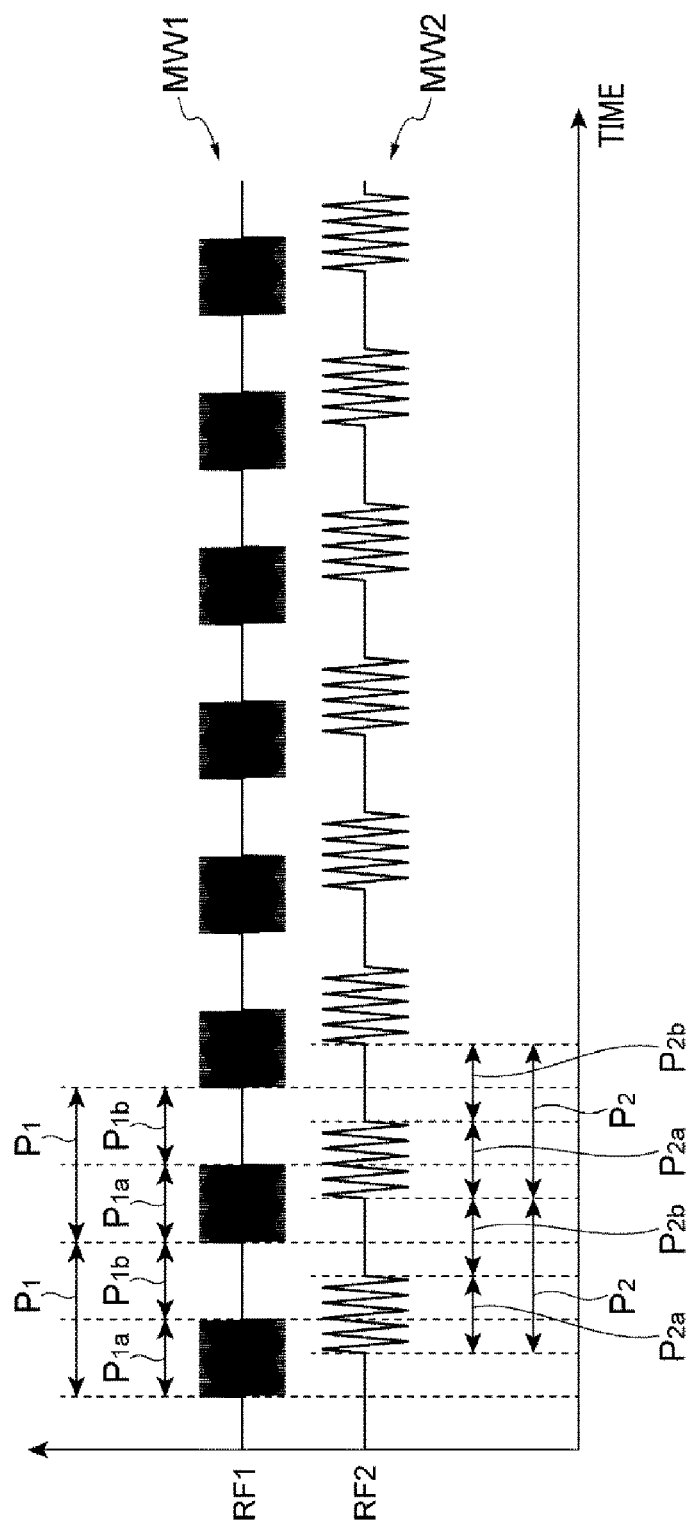
FIG. 7 is a diagram illustrating an example of the first high frequency power and the second high frequency power output in a fifth mode.

As illustrated in FIG. 6, in a fourth mode, the high frequency power supply 36 outputs the modulated wave MW1, and the high frequency power supply 38 outputs the modulated wave MW2. In the fourth mode, the modulation frequency $f_{M1}$ and the modulation frequency $f_{M2}$ are same and may be, for example, equal to or higher than 10 Hz. In the fourth mode, the modulated wave MW1 and the modulated wave MW2 are synchronized. As depicted in FIG. 7, in a fifth mode, the high frequency power supply 36 outputs the modulated wave MW1, and the high frequency power supply 38 outputs the modulated wave MW2. In the fifth mode, the modulation frequency $f_{M1}$ and the modulation frequency $f_{M2}$ are same and may be, for example, equal to or higher than 10 Hz. In the fifth mode, the modulated wave MW1 and the modulated wave MW2 are not synchronized. That is, there is a phase difference between the modulation cycle $P_1$ of the modulated wave MW1 and the modulation cycle $P_2$ of the modulated wave MW2. As an example, as shown in FIG. 7, the modulation cycle $P_2$ starts from a middle of the modulation cycle $P_1$ and ends after the modulation cycle $P_1$ ends.

As depicted in FIG. 8, in a sixth mode, the high frequency power supply 36 outputs the modulated wave MW1, and the high frequency power supply 38 outputs the double-modulated wave DW2. In the sixth mode, the modulation frequency $f_{M1}$ and the first modulation frequency $f_{D21}$ are same and may be, for example, equal to or higher than 10 kHz. In the sixth mode, the modulated wave MW1 and the double-modulated wave DW2 are synchronized. That is, in the sixth mode, the modulation cycle $P_1$ and the modulation cycle $P_{21}$ are synchronized. Further, the period $P_{1a}$ and the period $P_{21a}$ are synchronized, and the period $P_{1b}$ and the period $P_{21b}$ are also synchronized.

As depicted in FIG. 9, in a seventh mode, the high frequency power supply 36 outputs the double-modulated wave DW1, and the high frequency power supply 38 outputs the modulated wave MW2. In the seventh mode, the second modulation frequency $f_{D12}$ and the modulation frequency $f_{M2}$ are same. In the seventh mode, the modulated wave MW1 and the double-modulated wave DW2 are synchronized. That is, in the seventh mode, the modulation cycle $P_2$ and the modulation cycle $P_{12}$ are synchronized. Further, the period $P_{12a}$ and the period $P_{2a}$ are synchronized, and the period $P_{12b}$ and the period $P_{2b}$ are synchronized.

Figure 10:
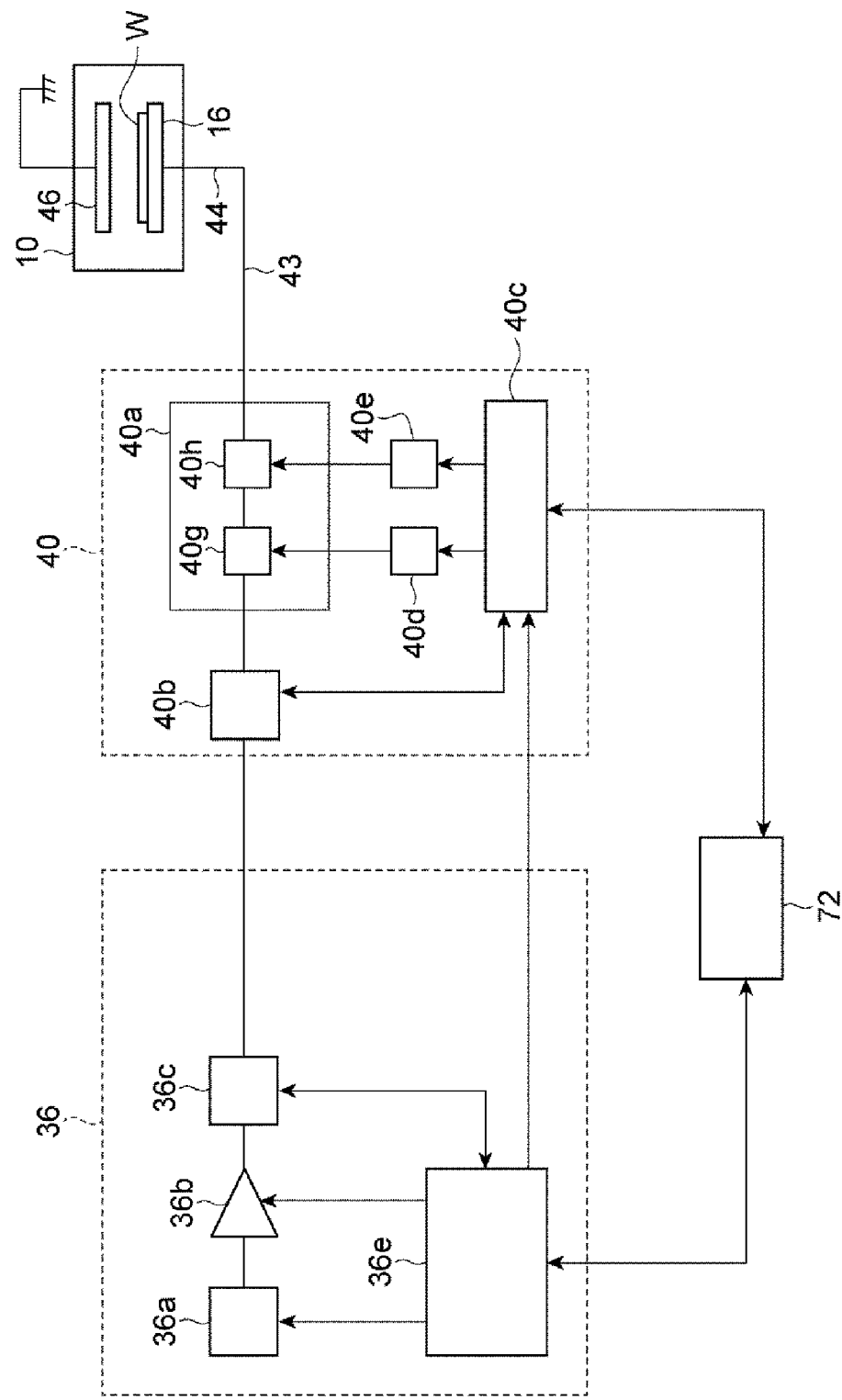
FIG. 10 is a diagram illustrating an example configuration of a first high frequency power supply and a first matching device.
Figure 11:
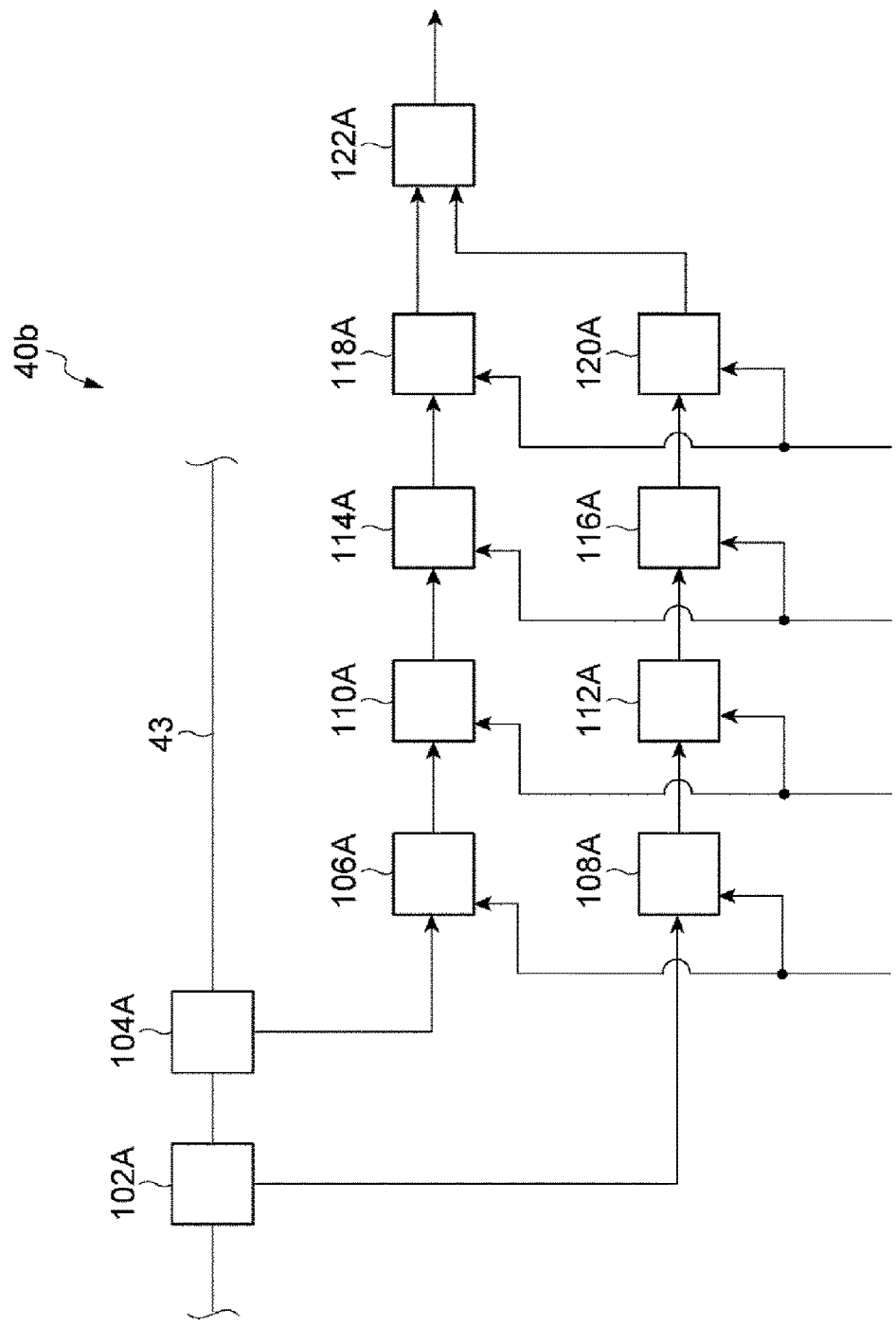
FIG. 11 is a diagram illustrating a configuration of an impedance sensor of the first matching device.
Figure 12:
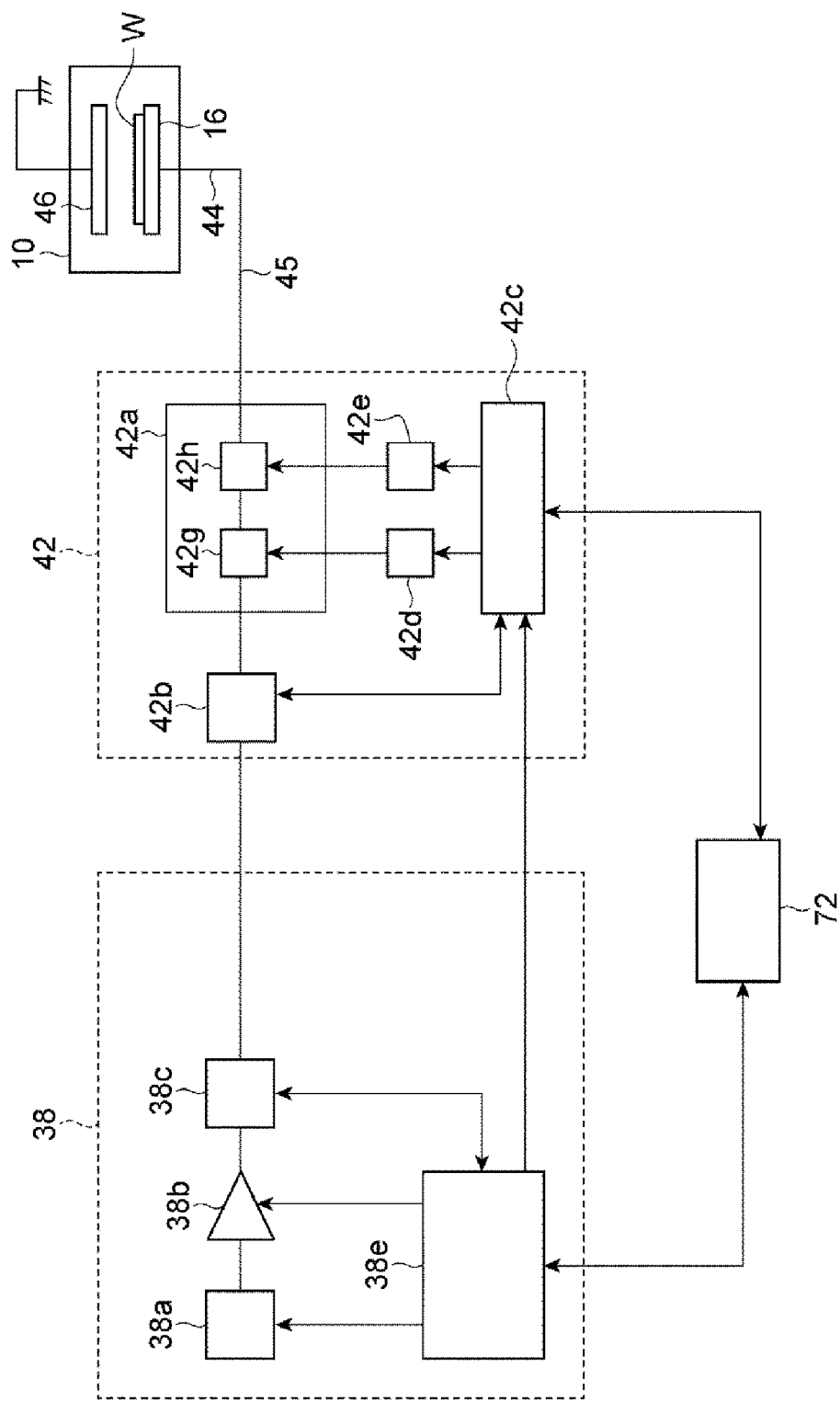
FIG. 12 is a diagram illustrating an example configuration of a second high frequency power supply and a second matching device.
Figure 13:
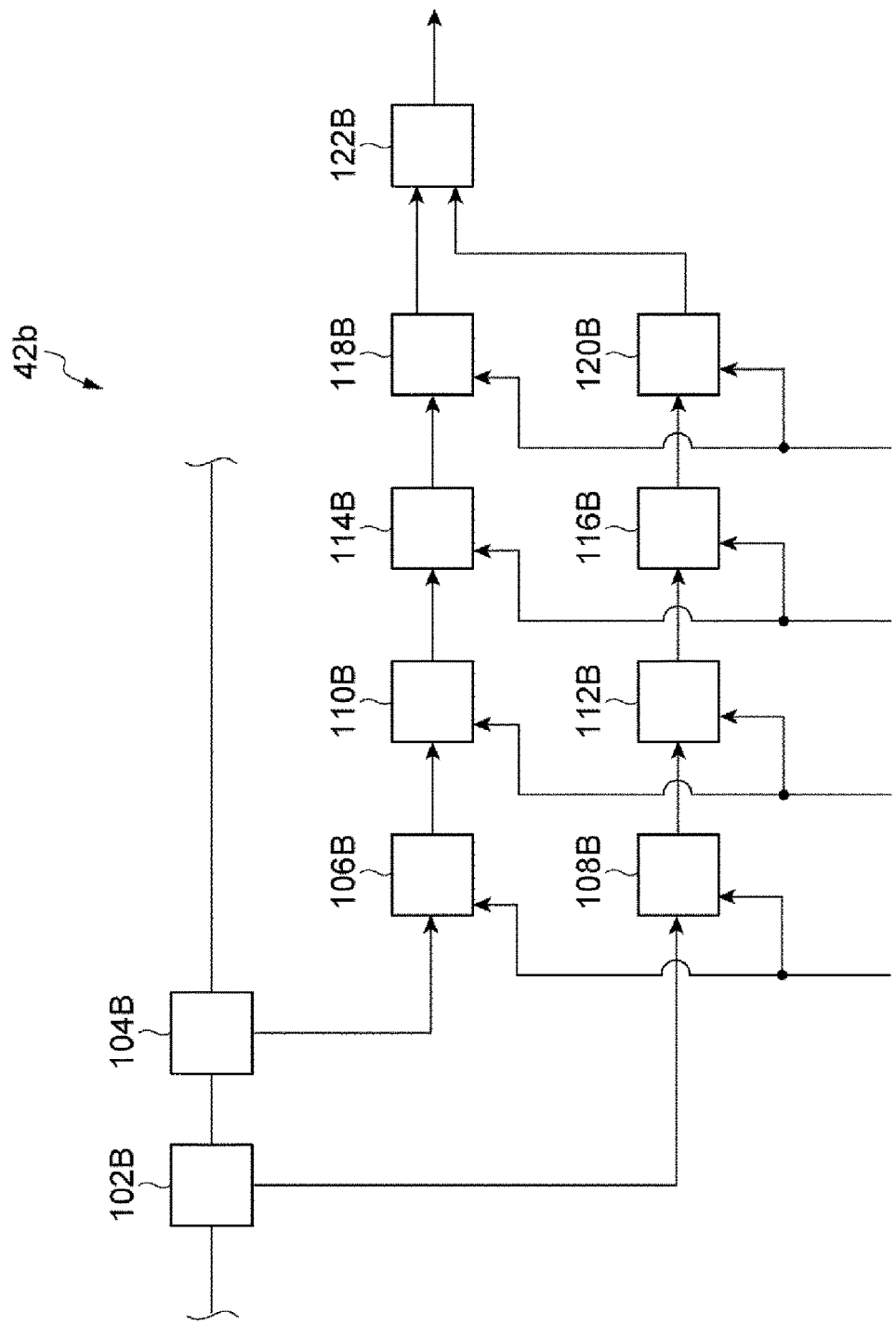
FIG. 13 is a diagram illustrating an example configuration of an impedance sensor of the second matching device.

Hereinafter, referring to FIG. 10 to FIG. 20, the high frequency power supply 36, the high frequency power supply 38, the matching device 40 and the matching device 42 will be described in detail. FIG. 10 is a diagram illustrating an example configuration of the first high frequency power supply and the first matching device. FIG. 11 is a diagram illustrating an example configuration of an impedance sensor of the first matching device. FIG. 12 is a diagram illustrating an example configuration of the second high frequency power supply and the second matching device. FIG. 13 is a diagram illustrating an impedance sensor of the second matching device. FIG. 14 to FIG. 20 are diagrams illustrating the first high frequency power and the second high frequency power in the first to seventh modes in relation with impedance monitoring periods.

As depicted in FIG. 10, in the exemplary embodiment, the high frequency power supply 36 includes an oscillator 36a, a power amplifier 36b, a power sensor 36c and a power supply controller 36e. The power supply controller 36e is composed of a processor such as a CPU and controls the oscillator 36a, the power amplifier 36b and the power sensor 36c by applying control signals individually to the oscillator 36a, the power amplifier 36b and the power sensor 36c with a signal sent from the main controller 72 and a signal sent from the power sensor 36c.

The signal sent from the main controller 72 to the power supply controller 36e includes a basic frequency specifying signal, a mode specifying signal and a parameter specifying signal. The basic frequency specifying signal specifies the basic frequency $f_{B1}$. The mode specifying signal specifies a mode to be used among the aforementioned first to seventh modes. The parameter specifying signal specifies various parameters related to setting or modulation of the level of the high frequency power RF1. To elaborate, in case that the high frequency power RF1 is the continuous wave CW1, the parameter specifying signal specifies the level (power) of the continuous wave CW1. In case that the high frequency power RF1 is the modulated wave MW1, the parameter specifying signal specifies a phase of the modulated wave MW1, the modulation frequency $f_{M1}$, a ratio (duty ratio) of the period $P_{1a}$ occupying in the modulation cycle $P_1$, the level (power) of the modulated wave MW1 in the period $P_{1a}$ and the level (power) of the modulated wave MW1 in the period $P_{1b}$. In case that the high frequency power RF1 is the double-modulated wave DW1, the parameter specifying signal specifies the first modulation frequency $f_{D11}$, a ratio (duty ratio) of the period $P_{11a}$ occupying in the modulation cycle $P_{11}$, the second modulation frequency $f_{D12}$, a ratio (duty ratio) of the period $P_{12a}$ occupying in the modulation cycle $P_{12}$, the level (power) of the double-modulated wave DW1 in the period during which the period $P_{11a}$ and the period $P_{12a}$ are overlapped, and the levels (powers) of the double-modulated wave DW1 in the period $P_{11b}$ and the period $P_{12b}$.

The power supply controller 36e controls the oscillator 36a to output the high frequency power having the basic frequency $f_{B1}$ specified by the basic frequency specifying signal. An output of the oscillator 36a is connected to an input of the power amplifier 36b. The power supply controller 36e controls the power amplifier 36b to set or modulate the level of the high frequency power output from the oscillator 36a according to the mode specified by the mode specifying signal and the various parameters specified by the parameter specifying signal. Accordingly, the continuous wave CW1, the modulated wave MW1 or the double-modulated wave DW1 is outputted from the power amplifier 36b as the high frequency power RF1.

An output of the power amplifier 36b is connected to the power feed line 43 via the power sensor 36c. The power sensor 36c is equipped with a directional coupler, a progressive wave power detector and a reflection wave power detector. The directional coupler sends a part of a progressive wave of the high frequency power RF1 to the progressive wave power detector, and sends a reflection wave to the reflection wave power detector. The basic frequency specifying signal which specifies the basic frequency $f_{B1}$ is applied to the power sensor 36c from the power supply controller 36e. The progressive wave power detector generates a measurement value of a power of a component having the basic frequency $f_{B1}$ among all frequency components of the progressive wave, i.e., generates a progressive wave power measurement value. This progressive wave power measurement value is sent to the power supply controller 36e for power feedback.

The reflection wave power detector generates a measurement value of a power of a component having the basic frequency $f_{B1}$ among all frequency components of the reflection wave, i.e., generates a first reflection wave power measurement value, and also generates a measurement value of a total power of the all frequency components of the reflection wave, i.e., generates a second reflection wave power measurement value. The first reflection wave power measurement value is sent to the main controller 72 for monitor display. Further, the second reflection wave power measurement value is sent to the power supply controller 36e for protection of the power amplifier 36b.

In case that the high frequency power supply 36 outputs the modulated wave MW1, the power supply controller 36e sends, to the matching controller 40c of the matching device 40, a pulse signal having a level which is modulated in synchronization with the modulation of the level (power) of the modulated wave MW1. In case that the high frequency power supply 36 outputs the double-modulated wave DW1, the power supply controller 36e sends, to the matching controller 40c of the matching device 40, a pulse signal having a level which is modulated in synchronization with the modulation of the level (power) of the double-modulated wave DW1.

The matching device 40 is equipped with a matching circuit 40a, an impedance sensor 40b, the matching controller 40c and actuators 40d and 40e. The matching circuit 40a includes variable reactance elements 40g and 40h. The variable reactance elements 40g and 40h may be implemented by, but not limited to, variable capacitors. Further, the matching circuit 40a may further include an inductor or the like.

The matching controller 40c is composed of, for example, a processor such as a CPU, and is operated under the control of the main controller 72. The matching controller 40c is configured to adjust a reactance of each of the variable reactance elements 40g and 40h by controlling the actuators 40d and 40e such that the impedance at the load side of the high frequency power supply 36 equals or approximates to the matching point. Each of the actuators 40d and 40e is implemented by, for example, a motor.

The matching controller 40c sends, to the impedance sensor 40b, a period specifying signal specifying a monitoring period of the impedance at the load side of the high frequency power supply 36. For the purpose, in the exemplary embodiment, the aforementioned pulse signal is sent to the matching controller 40c from the power supply controller 36e. Further, the matching controller 40c also receives the mode specifying signal and the parameter specifying signal from the main controller 72. The matching controller 40c generates the period specifying signal by using the pulse signal, the mode specifying signal and the parameter specifying signal applied thereto.

To elaborate, the matching controller 40c determines, from the mode specifying signal, whether a lowest modulation frequency used in the generation of the high frequency power RF1 and the high frequency power RF2 is commonly used in the generation of both the high frequency power RF1 and the high frequency power RF2. That is, if one of the first mode, the second mode, the third mode and the sixth mode is used, the matching controller 40c determines that the lowest modulation frequency used in the generation of the high frequency power RF1 and the high frequency power RF2 is not commonly used in the generation of both the high frequency power RF1 and the high frequency power RF2. Meanwhile, if one of the fourth mode, the fifth mode and the seventh mode is used, it is determined that the lowest modulation frequency used in the generation of the high frequency power RF1 and the high frequency power RF2 is commonly used in the generation of both the high frequency power RF1 and the high frequency power RF2.

If the lowest modulation frequency used in the generation of the high frequency power RF1 and the high frequency power RF2 is not commonly used in the generation of both the high frequency power RF1 and the high frequency power RF2 but used only in the generation of the high frequency power RF1 output from the high frequency power supply 36, the matching controller 40c generates a period specifying signal for setting a monitoring period within one period (high-level period) of two periods alternately repeated at the lowest modulation frequency. Further, if the lowest modulation frequency used in the generation of the high frequency power RF1 and the high frequency power RF2 is not commonly used in the generation of both the high frequency power RF1 and the high frequency power RF2 but used only in the generation of the high frequency power RF2 output from the high frequency power supply 38, the matching controller 40c generates a period specifying signal for setting a monitoring period within each of the two periods alternately repeated at the lowest modulation frequency.

Figure 14:
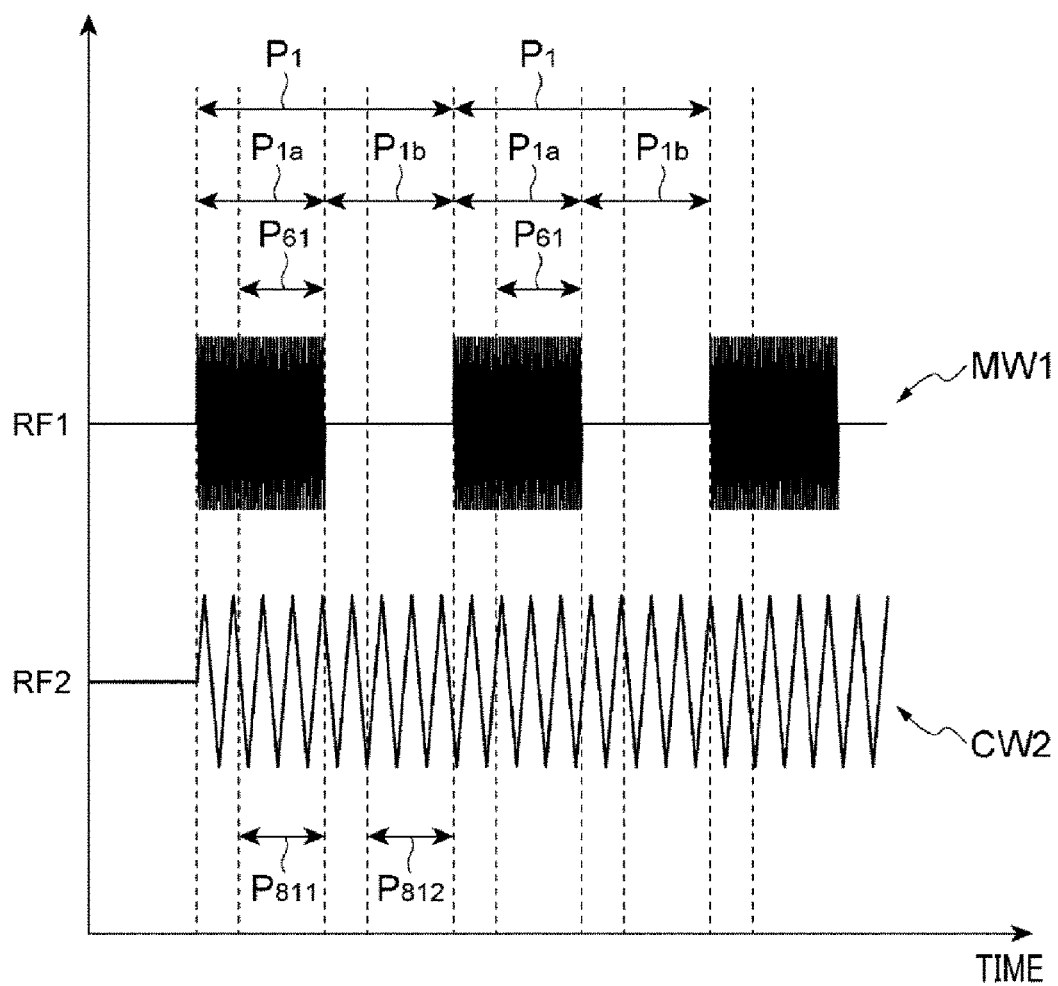
FIG. 14 is a diagram showing the first high frequency power and the second high frequency power in the first mode in relation with an impedance monitoring period.

In the first mode, the lowest modulation frequency used in the generation of the high frequency power RF1 and the high frequency power RF2 is the modulation frequency $f_{M1}$, and, as depicted in FIG. 14, a monitoring period $P_{61}$ is set within the period $P_{1a}$. The monitoring period $P_{61}$ may be a time period within the period $P_{1a}$ except a preset length of time from the beginning of the period $P_{1a}$.

Figure 15:
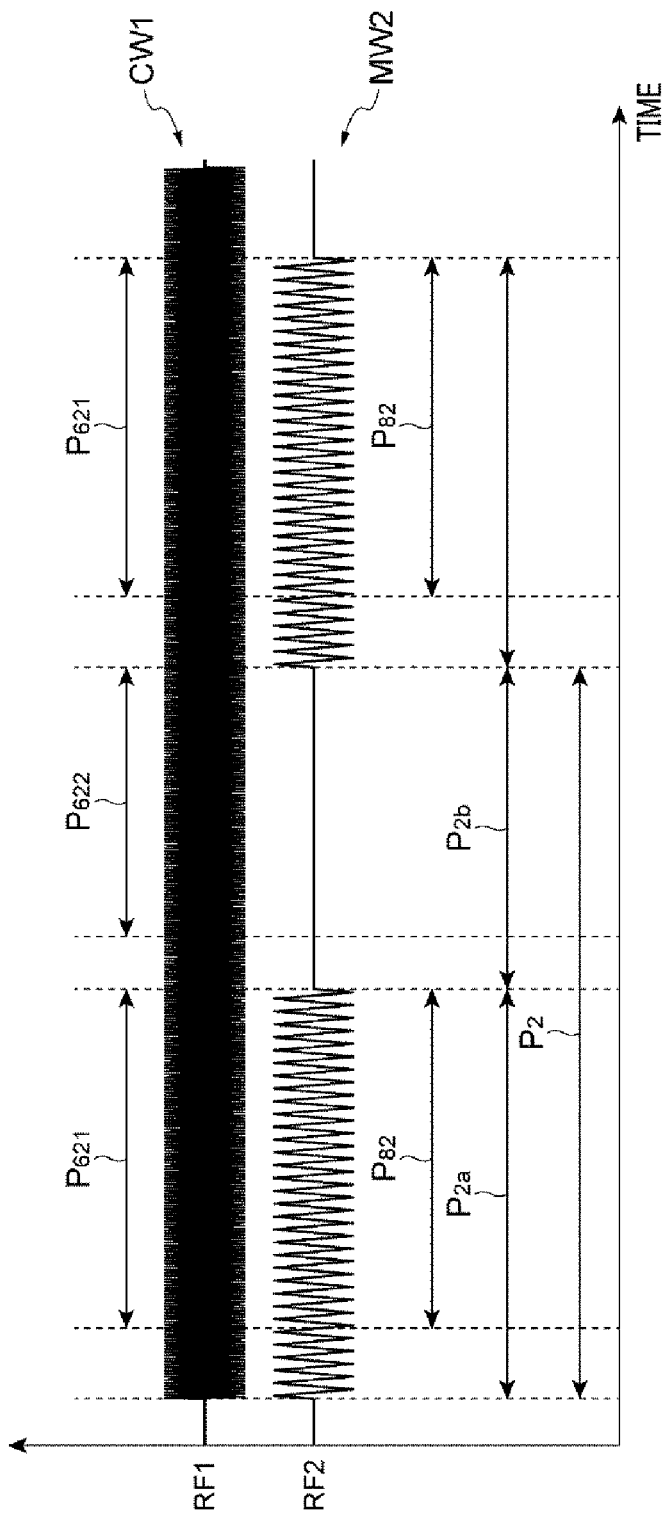
FIG. 15 is a diagram showing the first high frequency power and the second high frequency power in the second mode in relation with an impedance monitoring period.

In the second mode, the lowest modulation frequency used in the generation of the high frequency power RF1 and the high frequency power RF2 is the modulation frequency $f_{M2}$, and, as shown in FIG. 15, a monitoring period $P_{621}$ is set within the period $P_{2a}$ and a monitoring period $P_{622}$ is set within the period $P_{2b}$. The monitoring period $P_{621}$ may be a time period within the period $P_{2a}$ except a preset length of time from the beginning of the period $P_{2a}$. The monitoring period $P_{622}$ may be a time period within the period $P_{2b}$ except a preset length of time from the beginning of the period $P_{2b}$.

Figure 16:
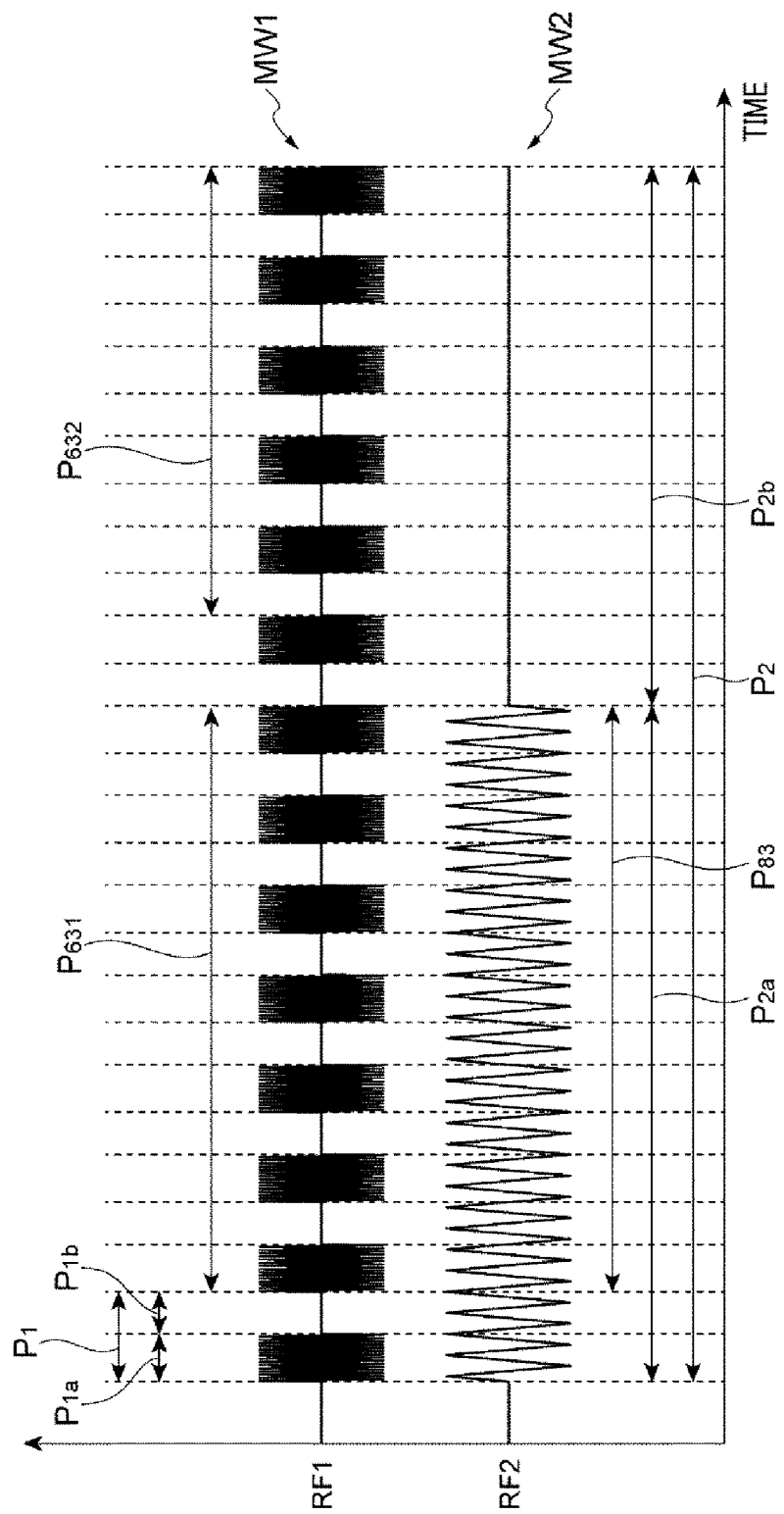
FIG. 16 is a diagram showing the first high frequency power and the second high frequency power in the third mode in relation with an impedance monitoring period.

In the third mode, the lowest modulation frequency used in the generation of the high frequency power RF1 and the high frequency power RF2 is the modulation frequency $f_{M2}$, and, as shown in FIG. 16, a monitoring period $P_{631}$ is set within the period $P_{2a}$ and a monitoring period $P_{632}$ is set within the period $P_{2b}$. The monitoring period $P_{631}$ may be a time period within the period $P_{2a}$ except a preset length of time from the beginning of the period $P_{2a}$. The monitoring period $P_{632}$ may be a time period within the period $P_{2b}$ except a preset length of time from the beginning of the period $P_{2b}$.

Figure 19:
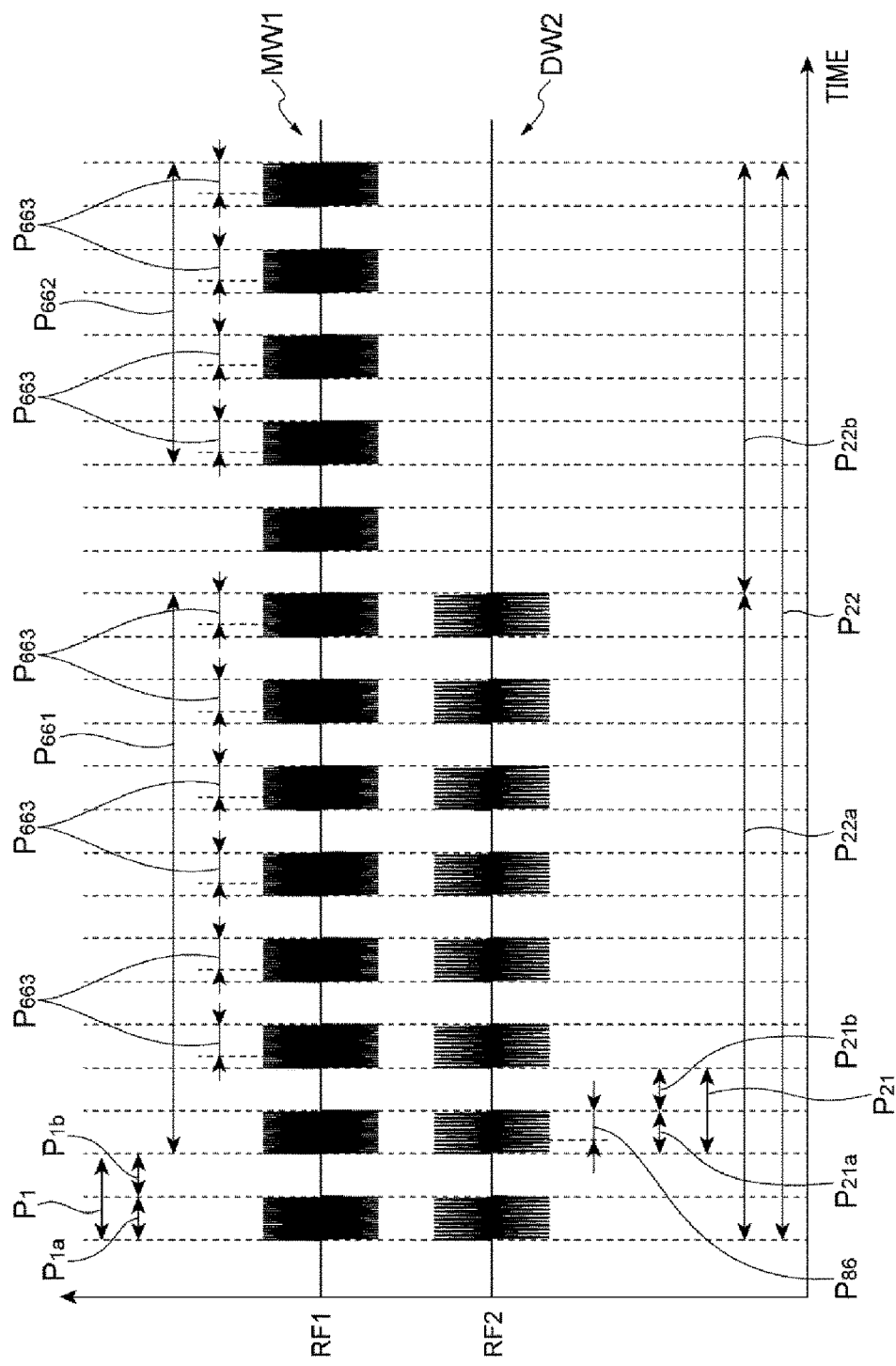
FIG. 19 is a diagram showing the first high frequency power and the second high frequency power in the sixth mode in relation with an impedance monitoring period.

In the sixth mode, the lowest modulation frequency used in the generation of the high frequency power RF1 and the high frequency power RF2 is the second modulation frequency $f_{D22}$, and, as shown in FIG. 19, a monitoring period $P_{661}$ is set within the period $P_{22a}$ and a monitoring period $P_{662}$ is set within the period $P_{22b}$. The monitoring period $P_{661}$ may be a time period within the period $P_{22a}$ except a preset length of time from the beginning of the period $P_{22a}$. The monitoring period $P_{662}$ may be a time period within the period $P_{22b}$ except a preset length of time from the beginning of the period $P_{22b}$. Further, if a filter 106A and a filter 108A of the impedance sensor 40b are capable of performing a sampling at a high rate, monitoring periods $P_{663}$ may be set within the monitoring period $P_{661}$ and the monitoring period $P_{662}$. Each monitoring period $P_{663}$ may be a time period within the period $P_{1a}$ except a preset length of time from the beginning of the period $P_{1a}$. This monitoring period $P_{663}$ may be designated by the period specifying signal.

If the lowest modulation frequency used in the generation of the high frequency power RF1 and the high frequency power RF2 is commonly used in the generation of both the high frequency power RF1 and the high frequency power RF2, the matching controller 40c generates a period specifying signal for setting a monitoring period within one period (high-level period) of two periods alternately repeated at the corresponding lowest modulation frequency.

Figure 17:
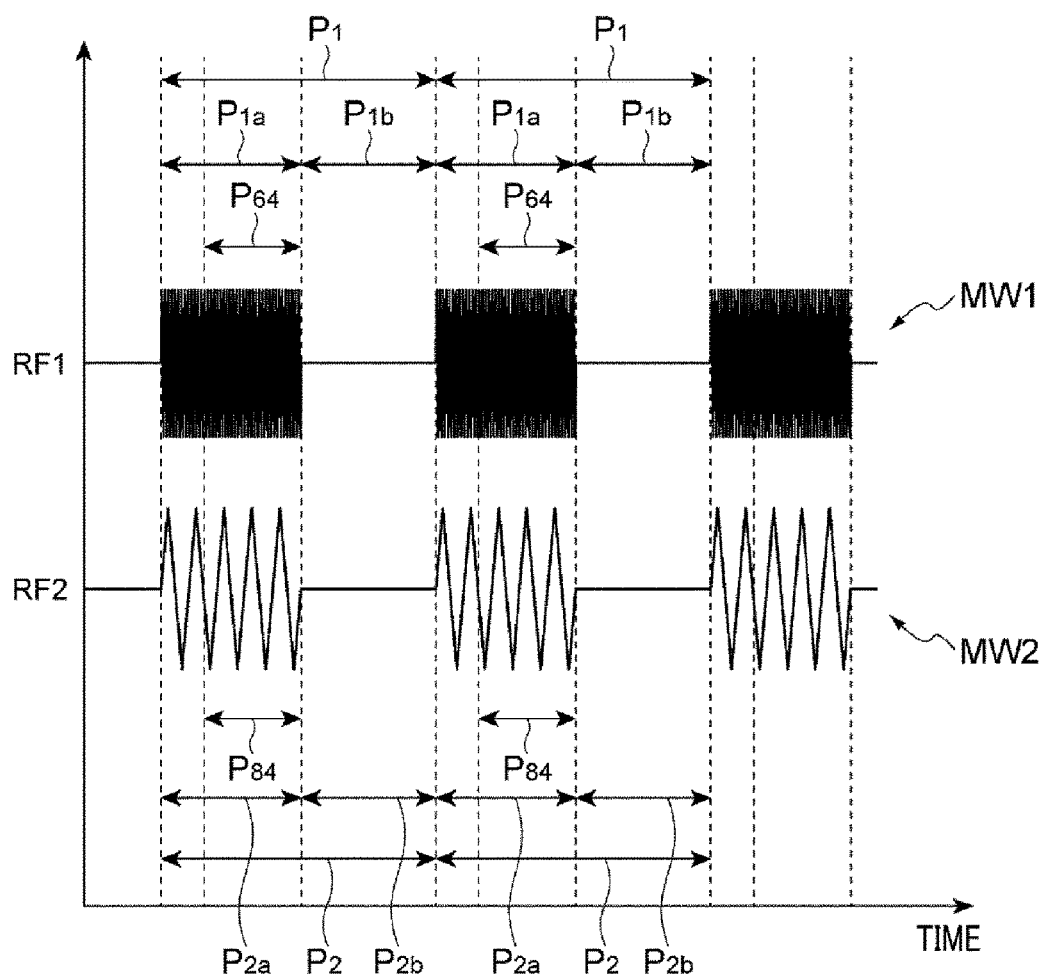
FIG. 17 is a diagram showing the first high frequency power and the second high frequency power in the fourth mode in relation with an impedance monitoring period.

In the fourth mode, the lowest modulation frequency used in the generation of the high frequency power RF1 and the high frequency power RF2 is the modulation frequency $f_{M1}$ and the modulation frequency $f_{M2}$, and, as shown in FIG. 17, a monitoring period $P_{64}$ is set within the period $P_{1a}$. The monitoring period $P_{64}$ may be a time period within the period $P_{1a}$ except a preset length of time from the beginning of the period $P_{1a}$.

Figure 18:
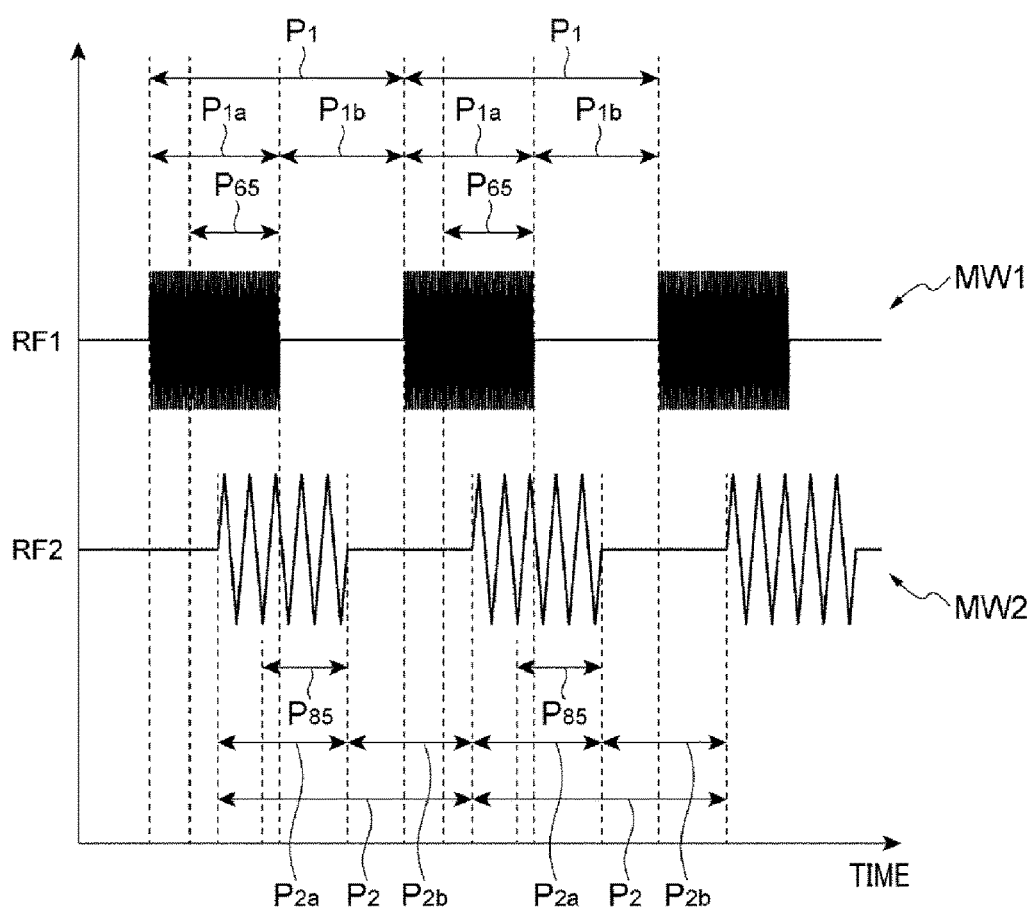
FIG. 18 is a diagram showing the first high frequency power and the second high frequency power in the fifth mode in relation with an impedance monitoring period.

In the fifth mode, the lowest modulation frequency used in the generation of the high frequency power RF1 and the high frequency power RF2 is the modulation frequency $f_{M1}$ and the modulation frequency $f_{M2}$, and, as shown in FIG. 18, a monitoring period $P_{65}$ is set within the period $P_{1a}$. The monitoring period $P_{65}$ may be a time period within the period $P_{1a}$ except a preset length of time from the beginning of the period $P_{1a}$.

Figure 20:
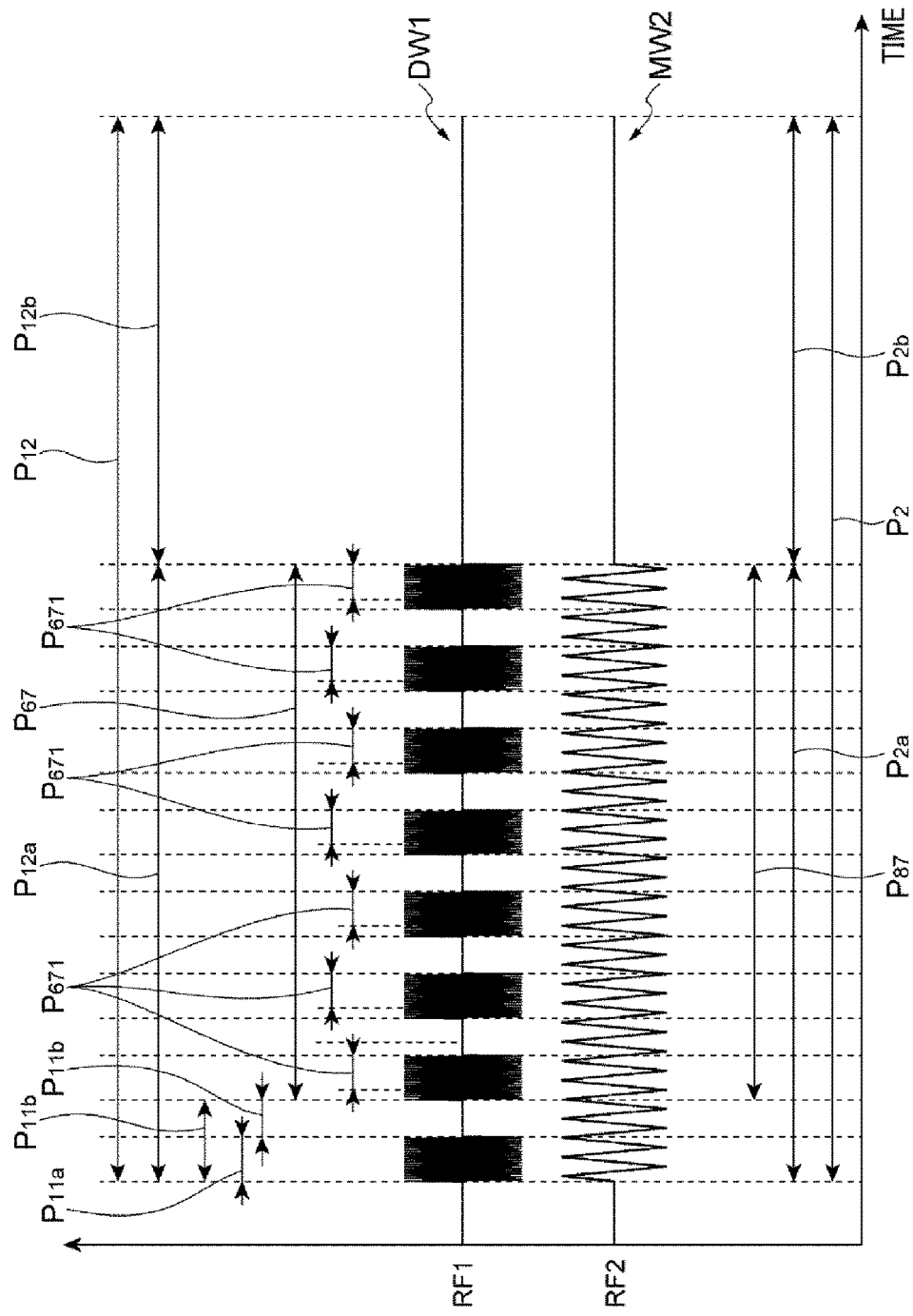
FIG. 20 is a diagram showing the first high frequency power and the second high frequency power in the seventh mode in relation with an impedance monitoring period.

In the seventh mode, the lowest modulation frequency used in the generation of the high frequency power RF1 and the high frequency power RF2 is the second modulation frequency $f_{D12}$ and the modulation frequency $f_{M2}$, and, as shown in FIG. 20, a monitoring period $P_{67}$ is set within the period $P_{12a}$. The monitoring period $P_{67}$ may be a time period within the period $P_{12a}$ except a preset length of time from the beginning of the period $P_{12a}$. Further, if the filter 106A and the filter 108A of the impedance sensor 40b are capable of performing the sampling at a high rate, multiple monitoring periods $P_{671}$ may be set within the monitoring period $P_{67}$. Each monitoring period $P_{671}$ may be a time period within the period $P_{11a}$ except a preset length of time from the beginning of the period $P_{11a}$. This monitoring period $P_{671}$ may be designated by the period specifying signal.

As depicted in FIG. 11, the impedance sensor 40b includes a current detector 102A, a voltage detector 104A, the filter 106A, the filter 108A, an average value calculator 110A, an average value calculator 112A, an average value calculator 114A, an average value calculator 116A, a moving average value calculator 118A, a moving average value calculator 120A and an impedance calculator 122A. Here, however, the impedance sensor 40b may not have the average value calculator 114A and the average value calculator 116A.

The voltage detector 104A is configured to detect a voltage waveform of the high frequency power RF1 transmitted on the power feed line 43 and output a voltage waveform analog signal indicating the corresponding voltage waveform. This voltage waveform analog signal is input to the filter 106A. The filter 106A is configured to generate a filtered voltage waveform signal by extracting components of the basic frequency $f_{B1}$ from the voltage waveform analog signal input thereto and performing a sampling of the extracted components. The filter 106A may be composed of, by way of non-limiting example, a FPGA (Field Programmable Gate Array).

The filtered voltage waveform signal generated by the filter 106A is output to the average value calculator 110A. The aforementioned period specifying signal is sent to the average value calculator 110A from the matching controller 40c. Alone or in cooperation with the average value calculator 114A, the average value calculator 110A calculates an average value VA1 of voltages on the power feed line 43 in the monitoring period specified by the period specifying signal. The average value VA1 is an average value of the voltages belonging to a first average value group.

In the first mode, the average value calculator 110A calculates the average value VA1 of the voltages of the filtered voltage waveform signal in the monitoring period $P_{61}$ within each modulation cycle $P_1$. In the second mode, the average value calculator 110A calculates the average value VA1 of the voltages of the filtered voltage waveform signal in the monitoring period $P_{621}$ and the monitoring period $P_{622}$ within each modulation cycle $P_2$. In the third mode, the average value calculator 110A calculates the average value VA1 of the voltages of the filtered voltage waveform signal in the monitoring period $P_{631}$ and the monitoring period $P_{632}$ within each modulation cycle $P_2$. In the fourth mode, the average value calculator 110A calculates the average value VA1 of the voltages of the filtered voltage waveform signal in the monitoring period $P_{64}$ within each modulation cycle $P_1$. In the fifth mode, the average value calculator 110A calculates the average value VA1 of the voltages of the filtered voltage waveform signal in the monitoring period $P_{65}$ within each modulation cycle $P_1$.

In the sixth mode, the average value calculator 110A calculates the average value VA1 of the voltages of the filtered voltage waveform signal in the monitoring period $P_{661}$ and the monitoring period $P_{662}$ within each modulation cycle $P_{22}$. Further, the average value calculator 110A may calculate multiple average values VA11 of the voltages of the filtered voltage waveform signal in the monitoring periods $P_{663}$ set within the monitoring period $P_{661}$ and multiple average values VA12 of the voltages of the filtered voltage waveform signal in the monitoring periods $P_{663}$ set within the monitoring period $P_{662}$, and the average value calculator 114A may calculate an average value of the average values VA11 and VA12 as the average value VA1.

In the seventh mode, the average value calculator 110A calculates the average value VA1 of the voltages of the filtered voltage waveform signal in the monitoring period $P_{67}$ within each modulation cycle $P_{12}$. Further, the average value calculator 110A may calculate multiple average values VA17 of the voltages of the filtered voltage waveform signal in the monitoring periods $P_{671}$ set within the monitoring period $P_{67}$, and the average value calculator 114A may calculate an average value of the average values VA17 as the average value VA1. Each of the average value calculator 110A and the average value calculator 114A may be composed of, for example, a FPGA.

The average value VA1 is periodically calculated at the same frequency as the lowest modulation frequency used in the generation of the high frequency power RF1 and the high frequency power RF2. The moving average value calculator 118A calculates a moving average value VMA1 from a preset number (plurality) of the average values VA1 which are obtained periodically. The moving average value calculator 118A may be composed of, by way of non-limiting example, a typical CPU. The moving average value VMA1 is output to the impedance calculator 122A.

The current detector 102A is configured to detect a current waveform of the high frequency power RF1 transmitted on the power feed line 43 and output a current waveform analog signal indicating the corresponding current waveform. This current waveform analog signal is input to the filter 108A. The filter 108A is configured to generate a filtered current waveform signal by extracting components of the basic frequency $f_{B1}$ from the current waveform analog signal input thereto and performing a sampling of the extracted components. The filter 108A may be composed of, by way of non-limiting example, a FPGA (Field Programmable Gate Array).

The filtered current waveform signal generated by the filter 108A is output to the average value calculator 112A. The aforementioned period specifying signal is sent to the average value calculator 112A from the matching controller 40c. Alone or in cooperation with the average value calculator 116A, the average value calculator 112A calculates an average value IA1 of a current on the power feed line 43 in the monitoring period specified by the period specifying signal. The average value IA1 is an average value of the currents belonging to the first average value group.

In the first mode, the average value calculator 112A calculates the average value IA1 of the currents of the filtered current waveform signal in the monitoring period $P_{61}$ within each modulation cycle $P_1$. In the second mode, the average value calculator 112A calculates the average value IA1 of the currents of the filtered current waveform signal in the monitoring period $P_{621}$ and the monitoring period $P_{622}$ within each modulation cycle $P_2$. In the third mode, the average value calculator 112A calculates the average value IA1 of the currents of the filtered current waveform signal in the monitoring period $P_{631}$ and the monitoring period $P_{632}$ within each modulation cycle $P_2$. In the fourth mode, the average value calculator 112A calculates the average value IA1 of the currents of the filtered current waveform signal in the monitoring period $P_{64}$ within each modulation cycle $P_1$. In the fifth mode, the average value calculator 112A calculates the average value IA1 of the currents of the filtered current waveform signal in the monitoring period $P_{65}$ within each modulation cycle $P_1$.

In the sixth mode, the average value calculator 112A calculates the average value IA1 of the currents of the filtered current waveform signal in the monitoring period $P_{661}$ and the monitoring period $P_{662}$ within each modulation cycle $P_{22}$. Further, the average value calculator 112A may calculate multiple average values IA11 of the currents of the filtered current waveform signal in the monitoring periods $P_{663}$ set within the monitoring period $P_{661}$ and multiple average values IA12 of the currents of the filtered current waveform signal in the monitoring periods $P_{663}$ set within the monitoring period $P_{662}$, and the average value calculator 116A may calculate an average value of the average values IA11 and IA12 as the average value IA1.

In the seventh mode, the average value calculator 112A calculates the average value IA1 of the currents of the filtered current waveform signal in the monitoring period $P_{67}$ within each modulation cycle $P_{12}$. Further, the average value calculator 112A may calculate multiple average values IA17 of the currents of the filtered current waveform signal in the monitoring periods $P_{671}$ set within the monitoring period $P_{67}$, and the average value calculator 116A may calculate an average value of the average values IA17 as the average value IA1. Each of the average value calculator 112A and the average value calculator 116A may be composed of, for example, a FPGA.

The average value IA1 is periodically calculated at the same frequency as the lowest modulation frequency used in the generation of the high frequency power RF1 and the high frequency power RF2. The moving average value calculator 120A calculates a moving average value IMA1 from a preset number (plurality) of the average values IA1 which are obtained periodically. The moving average value calculator 120A may be composed of, by way of non-limiting example, a typical CPU. The moving average value IMA1 is output to the impedance calculator 122A.

The impedance calculator 122A calculates a first moving average value of the impedance at the load side of the high frequency power supply 36 from the moving average value IMA1 and the moving average value VMA1. The first moving average value includes an absolute value and a phase component. The first moving average value obtained by the impedance calculator 122A is output to the matching controller 40c. The matching controller 40c performs impedance matching by using the first moving average value. To elaborate, the matching controller 40c adjusts a reactance of each of the variable reactance elements 40g and 40h by controlling the actuators 40d and 40e such that the impedance at the load side of the high frequency power supply 36 specified by the first moving average value approximates or equals to the matching point.

As shown in FIG. 12, in the exemplary embodiment, the high frequency power supply 38 includes an oscillator 38a, a power amplifier 38b, a power sensor 38c and a power supply controller 38e. The power supply controller 38e is composed of a processor such as a CPU and controls the oscillator 38a, the power amplifier 38b and the power sensor 38c by applying control signals individually to the oscillator 38a, the power amplifier 38b and the power sensor 38c with a signal sent from the main controller 72 and a signal sent from the power sensor 38c.

The signal sent from the main controller 72 to the power supply controller 38e includes a basic frequency specifying signal, a mode specifying signal and a parameter specifying signal. The basic frequency specifying signal specifies the basic frequency $f_{B2}$. The mode specifying signal specifies a mode to be used among the aforementioned first to seventh modes. The parameter specifying signal specifies various parameters related to setting or modulation of the level of the high frequency power RF2. To elaborate, in case that the high frequency power RF2 is the continuous wave CW2, the parameter specifying signal specifies the level (power) of the continuous wave CW2. In case that the high frequency power RF2 is the modulated wave MW2, the parameter specifying signal specifies a phase of the modulated wave MW2, the modulation frequency $f_{M2}$, a ratio (duty ratio) of the period $P_{2a}$ occupied in the modulation cycle $P_2$, the level (power) of the modulated wave MW2 in the period $P_{2a}$ and the level (power) of the modulated wave MW2 in the period $P_{2b}$. In case that the high frequency power RF2 is the double-modulated wave DW2, the parameter specifying signal specifies the first modulation frequency $f_{D21}$, a ratio (duty ratio) of the period $P_{21a}$ occupying in the modulation cycle $P_{21}$, the second modulation frequency $f_{D22}$, a ratio (duty ratio) of the period $P_{22a}$ occupying in the modulation cycle $P_{22}$, the level (power) of the double-modulated wave DW2 in the period during which the period $P_{21a}$ and the period $P_{22a}$ are overlapped, and the levels (powers) of the double-modulated wave DW2 in the period $P_{21b}$ and the period $P_{22b}$.

The power supply controller 38e controls the oscillator 38a to output the high frequency power having the basic frequency $f_{B2}$ specified by the basic frequency specifying signal. An output of the oscillator 38a is connected to an input of the power amplifier 38b. The power supply controller 38e controls the power amplifier 38b to set or modulate the level of the high frequency power output from the oscillator 38a according to the mode specified by the mode specifying signal and the various parameters specified by the parameter specifying signal. Accordingly, the continuous wave CW2, the modulated wave MW2 or the double-modulated wave DW2 is outputted from the power amplifier 38b as the high frequency power RF2.

An output of the power amplifier 38b is connected to the power feed line 45 via the power sensor 38c. The power sensor 38c is equipped with a directional coupler, a progressive wave power detector and a reflection wave power detector. The directional coupler sends a part of a progressive wave of the high frequency power RF2 to the progressive wave power detector, and sends a reflection wave to the reflection wave power detector. The basic frequency specifying signal specifying the basic frequency $f_{B2}$ is applied to the power sensor 38c from the power supply controller 38e. The progressive wave power detector generates a measurement value of a power of a component having the basic frequency $f_{B2}$ among all frequency components of the progressive wave, i.e., generates a progressive wave power measurement value. This progressive wave power measurement value is sent to the power supply controller 38e for power feedback.

The reflection wave power detector generates a measurement value of a power of a component having the basic frequency $f_{B2}$ among all frequency components of the reflection wave, i.e., generates a third reflection wave power measurement value, and also generates a measurement value of a total power of the all frequency components of the reflection wave, i.e., generates a fourth reflection wave power measurement value. The third reflection wave power measurement value is sent to the main controller 72 for monitor display. Further, the fourth reflection wave power measurement value is sent to the power supply controller 38e for protection of the power amplifier 38b.

In case that the high frequency power supply 38 outputs the modulated wave MW2, the power supply controller 38e sends, to the matching controller 42c of the matching device 42, a pulse signal having a level which is modulated in synchronization with the modulation of the level (power) of the modulated wave MW2. In case that the high frequency power supply 38 outputs the double-modulated wave DW2, the power supply controller 38e sends, to the matching controller 42c of the matching device 42, a pulse signal having a level which is modulated in synchronization with the modulation of the level (power) of the double-modulated wave DW2.

The matching device 42 is equipped with a matching circuit 42a, an impedance sensor 42b, the matching controller 42c and actuators 42d and 42e. The matching circuit 42a includes variable reactance elements 42g and 42h. The variable reactance elements 42g and 42h may be implemented by, but not limited to, variable capacitors. Further, the matching circuit 42a may further include an inductor or the like.

The matching controller 42c is composed of, for example, a processor such as a CPU, and is operated under the control of the main controller 72. The matching controller 42c is configured to adjust a reactance of each of the variable reactance elements 42g and 42h by controlling the actuators 42d and 42e such that the impedance at the load side of the high frequency power supply 38 equals or approximates to the matching point. Each of the actuators 42d and 42e is implemented by, for example, a motor.

The matching controller 42c sends, to the impedance sensor 42b, a period specifying signal specifying a monitoring period of the impedance at the load side of the high frequency power supply 38. For the purpose, in the exemplary embodiment, the aforementioned pulse signal is sent to the matching controller 42c from the power supply controller 38e. Further, the matching controller 42c also receives the mode specifying signal and the parameter specifying signal from the main controller 72. The matching controller 42c generates the period specifying signal by using the pulse signal, the mode specifying signal and the parameter specifying signal applied thereto.

To elaborate, the matching controller 42c determines, from the mode specifying signal, whether a lowest modulation frequency used in the generation of the high frequency power RF1 and the high frequency power RF2 is commonly used in the generation of both the high frequency power RF1 and the high frequency power RF2. That is, if one of the first mode, the second mode, the third mode and the sixth mode is used, the matching controller 42c determines that the lowest modulation frequency used in the generation of the high frequency power RF1 and the high frequency power RF2 is not commonly used in the generation of both the high frequency power RF1 and the high frequency power RF2. Meanwhile, if one of the fourth mode, the fifth mode and the seventh mode is used, it is determined that the lowest modulation frequency used in the generation of the high frequency power RF1 and the high frequency power RF2 is commonly used in the generation of the high frequency power RF1 and the high frequency power RF2.

If the lowest modulation frequency used in the generation of the high frequency power RF1 and the high frequency power RF2 is not commonly used in the generation of both the high frequency power RF1 and the high frequency power RF2 but used only in the generation of the high frequency power RF2 output from the high frequency power supply 38, the matching controller 42c generates a period specifying signal for setting a monitoring period within one period (high-level period) of two periods alternately repeated at the lowest modulation frequency. Further, if the lowest modulation frequency used in the generation of the high frequency power RF1 and the high frequency power RF2 is not commonly used in the generation of both the high frequency power RF1 and the high frequency power RF2 but used only in the generation of the high frequency power RF1 output from the high frequency power supply 36, the matching controller 42c generates a period specifying signal for setting a monitoring period within each of the two periods alternately repeated at the lowest modulation frequency.

In the first mode, the lowest modulation frequency used in the generation of the high frequency power RF1 and the high frequency power RF2 is the modulation frequency $f_{M1}$, and, as depicted in FIG. 14, a monitoring period $P_{811}$ is set within the period $P_{1a}$, and a monitoring period $P_{812}$ is set within the period $P_{1b}$. The monitoring period $P_{811}$ may be a time period within the period $P_{1a}$ except a preset length of time from the beginning of the period $P_{1a}$. The monitoring period $P_{812}$ may be a time period within the period $P_{1b}$ except a preset length of time from the beginning of the period $P_{1b}$.

In the second mode, the lowest modulation frequency used in the generation of the high frequency power RF1 and the high frequency power RF2 is the modulation frequency $f_{M2}$, and, as shown in FIG. 15, a monitoring period $P_{82}$ is set within the period $P_{2a}$. The monitoring period $P_{82}$ may be a time period within the period $P_{2a}$ except a preset length of time from the beginning of the period $P_{2a}$.

In the third mode, the lowest modulation frequency used in the generation of the high frequency power RF1 and the high frequency power RF2 is the modulation frequency $f_{M2}$, and, as shown in FIG. 16, a monitoring period $P_{83}$ is set within the period $P_{2a}$. The monitoring period $P_{83}$ may be a time period within the period $P_{2a}$ except a preset length of time from the beginning of the period $P_{2a}$.

In the sixth mode, the lowest modulation frequency used in the generation of the high frequency power RF1 and the high frequency power RF2 is the second modulation frequency $f_{D22}$, and, as shown in FIG. 19, a monitoring period $P_{86}$ is set within the period $P_{22a}$. In the exemplary embodiment, the monitoring period $P_{86}$ is set within a single period $P_{21a}$ within the period $P_{22a}$. The monitoring period $P_{86}$ may be a time period within the single period $P_{21a}$ except a preset length of time from the beginning of the period $P_{21a}$. Further, the monitoring period $P_{86}$ may be set in each of a plurality of periods $P_{21a}$ within the period $P_{22a}$.

If the lowest modulation frequency used in the generation of the high frequency power RF1 and the high frequency power RF2 is commonly used in the generation of both the high frequency power RF1 and the high frequency power RF2, the matching controller 42c generates a period specifying signal for setting a monitoring period within one period (high-level period) of two periods alternately repeated at the corresponding lowest modulation frequency.

In the fourth mode, the lowest modulation frequency used in the generation of the high frequency power RF1 and the high frequency power RF2 is the modulation frequency $f_{M1}$ and the modulation frequency $f_{M2}$, and, as shown in FIG. 17, a monitoring period $P_{84}$ is set within the period $P_{2a}$. The monitoring period $P_{84}$ may be a time period within the period $P_{2a}$ except a preset length of time from the beginning of the period $P_{2a}$.

In the fifth mode, the lowest modulation frequency used in the generation of the high frequency power RF1 and the high frequency power RF2 is the modulation frequency $f_{M1}$ and the modulation frequency $f_{M2}$, and, as shown in FIG. 18, a monitoring period $P_{85}$ is set within the period $P_{2a}$. The monitoring period $P_{85}$ may be a time period within the period $P_{2a}$ except a preset length of time from the beginning of the period $P_{2a}$.

In the seventh mode, the lowest modulation frequency used in the generation of the high frequency power RF1 and the high frequency power RF2 is the second modulation frequency $f_{D12}$ and the modulation frequency $f_{M2}$, and, as shown in FIG. 20, a monitoring period $P_{87}$ is set within the period $P_{2a}$. The monitoring period $P_{87}$ may be a time period within the period $P_{2a}$ except a preset length of time from the beginning of the period $P_{2a}$.

As depicted in FIG. 13, the impedance sensor 42b includes a current detector 102B, a voltage detector 104B, the filter 106B, the filter 108B, an average value calculator 110B, an average value calculator 112B, an average value calculator 114B, an average value calculator 116B, a moving average value calculator 118B, a moving average value calculator 120B and an impedance calculator 122B. Here, however, the impedance sensor 42b may not have the average value calculator 114B and the average value calculator 116B.

The voltage detector 104B is configured to detect a voltage waveform of the high frequency power RF2 transmitted on the power feed line 45 and output a voltage waveform analog signal indicating the corresponding voltage waveform. This voltage waveform analog signal is input to the filter 106B. The filter 106B is configured to generate a filtered voltage waveform signal by extracting components of the basic frequency $f_{B2}$ from the voltage waveform analog signal input thereto and performing a sampling of the extracted components. The filter 106B may be composed of, by way of non-limiting example, a FPGA (Field Programmable Gate Array).

The filtered voltage waveform signal generated by the filter 106B is output to the average value calculator 110B. The aforementioned period specifying signal is sent to the average value calculator 110B from the matching controller 42c. Alone or in cooperation with the average value calculator 114B, the average value calculator 110B calculates an average value VA2 of a voltage on the power feed line 45 in the monitoring period specified by the period specifying signal. The average value VA2 is an average value of the voltages belonging to a second average value group.

In the first mode, the average value calculator 110B calculates the average value VA2 of the voltages of the filtered voltage waveform signal in the monitoring period $P_{811}$ and the monitoring period $P_{812}$ within each modulation cycle $P_1$. In the second mode, the average value calculator 110B calculates the average value VA2 of the voltages of the filtered voltage waveform signal in the monitoring period $P_{82}$ within each modulation cycle $P_2$. In the third mode, the average value calculator 110B calculates the average value VA2 of the voltages of the filtered voltage waveform signal in the monitoring period $P_{83}$ within each modulation cycle $P_2$. In the fourth mode, the average value calculator 110B calculates the average value VA2 of voltage of the filtered voltage waveform signal in the monitoring period $P_{84}$ within each modulation cycle $P_2$. In the fifth mode, the average value calculator 110B calculates the average value VA2 of the voltages of the filtered voltage waveform signal in the monitoring period $P_{85}$ within each modulation cycle $P_2$.

In the sixth mode, the average value calculator 110B calculates the average value VA2 of the voltage of the filtered voltage waveform signal in the monitoring period $P_{86}$ within each modulation cycle $P_{22}$. Further, in case that monitoring periods $P_{86}$ are set within each modulation cycle $P_{22}$, the average value calculator 110B may calculate multiple average values VA26 of the voltages of the filtered voltage waveform signal in the monitoring periods $P_{86}$, and the average value calculator 114B may output an average value of the multiple average values VA26 as the average value VA2. In the seventh mode, the average value calculator 110B calculates the average value VA2 of the voltages of the filtered voltage waveform signal in the monitoring period $P_{87}$ within each modulation cycle $P_2$.

The average value VA2 is periodically calculated at the same frequency as the lowest modulation frequency used in the generation of the high frequency power RF1 and the high frequency power RF2. The moving average value calculator 118B calculates a moving average value VMA2 from a preset number (plurality) of the average values VA2 which are obtained periodically. The moving average value calculator 118B may be composed of, by way of non-limiting example, a typical CPU. The moving average value VMA2 is output to the impedance calculator 122B.

The current detector 102B is configured to detect a current waveform of the high frequency power RF2 transmitted on the power feed line 45 and output a current waveform analog signal indicating the corresponding current waveform. This current waveform analog signal is input to the filter 108B. The filter 108B is configured to generate a filtered current waveform signal by extracting components of the basic frequency $f_{B2}$ from the current waveform analog signal input thereto and performing a sampling of the extracted components. The filter 108B may be composed of, by way of non-limiting example, a FPGA (Field Programmable Gate Array).

The filtered current waveform signal generated by the filter 108B is output to the average value calculator 112B. The aforementioned period specifying signal is sent to the average value calculator 112B from the matching controller 42c. Alone or in cooperation with the average value calculator 116B, the average value calculator 112B calculates an average value IA2 of a current on the power feed line 45 in the monitoring period specified by the period specifying signal. The average value IA2 is an average value of the currents belonging to the second average value group.

In the first mode, the average value calculator 112B calculates the average value IA2 of the currents of the filtered current waveform signal in the monitoring period $P_{811}$ and the monitoring period $P_{812}$ within each modulation cycle $P_1$. In the second mode, the average value calculator 112B calculates the average value IA2 of the currents of the filtered current waveform signal in the monitoring period $P_{82}$ within each modulation cycle $P_2$. In the third mode, the average value calculator 112B calculates the average value IA2 of the currents of the filtered current waveform signal in the monitoring period $P_{83}$ within each modulation cycle $P_2$. In the fourth mode, the average value calculator 112B calculates the average value IA2 of the currents of the filtered current waveform signal in the monitoring period $P_{84}$ within each modulation cycle $P_1$. In the fifth mode, the average value calculator 112B calculates the average value IA2 of the currents of the filtered current waveform signal in the monitoring period $P_{85}$ within each modulation cycle $P_2$.

In the sixth mode, the average value calculator 112B calculates the average value IA2 of the currents of the filtered current waveform signal in the monitoring period $P_{86}$ within each modulation cycle $P_{22}$. Further, in case that monitoring periods $P_{86}$ are set within each modulation cycle $P_{22}$, the average value calculator 112B may calculate multiple average values IA26 of the currents of the filtered current waveform signal in the monitoring periods $P_{86}$, and the average value calculator 116B may output an average value of the multiple average values IA26 as the average value IA2. In the seventh mode, the average value calculator 112B calculates the average value IA2 of the currents of the filtered current waveform signal in the monitoring period $P_{87}$ within each modulation cycle $P_2$.

The average value IA2 is periodically calculated at the same frequency as the lowest modulation frequency used in the generation of the high frequency power RF1 and the high frequency power RF2. The moving average value calculator 120B calculates a moving average value IMA2 from a preset number (plurality) of the average values IA2 which are obtained periodically. The moving average value calculator 120B may be composed of, by way of non-limiting example, a typical CPU. The moving average value IMA2 is output to the impedance calculator 122B.

The impedance calculator 122B calculates a second moving average value of an impedance at a load side of the high frequency power supply 38 from the moving average value IMA2 and the moving average value VMA2. The second moving average value includes an absolute value and a phase component. The second moving average value obtained by the impedance calculator 122B is output to the matching controller 42c. The matching controller 42c performs an impedance matching by using the second moving average value. To elaborate, the matching controller 42c adjusts a reactance of each of the variable reactance elements 42g and 42h by controlling the actuators 42d and 42e such that the impedance at the load side of the high frequency power supply 38 specified by the second moving average value approximates to or equals to the matching point.

Now, reference is made back to FIG. 1. As shown in FIG. 1, in the method MT, a process ST1 is performed. In the process ST1, it is determined whether the lowest modulation frequency is commonly used in the generation of both the high frequency power RF1 and the high frequency power RF2. The determination of the process ST1 is performed by the matching controller 40c and the matching controller 42c. As an example, if one of the first mode, the second mode, the third mode and the sixth mode is performed, the matching controller 40c and the matching controller 42c determine that the lowest modulation frequency used in the generation of the high frequency power RF1 and the high frequency power RF2 is not commonly used in the generation of both the high frequency power RF1 and the high frequency power RF2. Meanwhile, if one of the fourth mode, the fifth mode and the seventh mode is performed, the matching controller 40c and the matching controller 42c determine that the lowest modulation frequency used in the generation of the high frequency power RF1 and the high frequency power RF2 is commonly used in the generation of both the high frequency power RF1 and the high frequency power RF2.

If the lowest modulation frequency is not commonly used in the generation of both the high frequency power RF1 and the high frequency power RF2, that is, if the lowest modulation frequency used in the generation of the high frequency power RF1 and the high frequency power RF2 is used only in the generation of the high frequency power output from one of the high frequency power supply 36 and the high frequency power supply 38, in a process ST2, an average value calculation by a first averaging processing is performed periodically.

In the first averaging processing, an average value of the currents and an average value of the voltages on one of the power feed line 43 and the power feed line 45 used for the transmission of the high frequency power from one of the high frequency power supplies at multiple time points in one period (high-level period) between two periods alternately repeated at the corresponding lowest modulation frequency are calculated. Further, in the first averaging processing, an average value of the currents and an average value of the voltages on the other power feed line at multiple time points in both of the two periods alternately repeated at the lowest modulation frequency are calculated. Accordingly, the first average value group (the average value VA1 and the average value IA1) and the second average value group (the average value VA2 and the average value IA2) are obtained.

To elaborate, in the first mode, as shown in FIG. 14, the average value VA1 of the voltages and the average value IA1 of the currents on the power feed line 43 in the monitoring period $P_{61}$ set within the period $P_{1a}$ within each modulation cycle $P_1$ are calculated. Further, in the first mode, the average value VA2 of the voltages and the average value IA2 of the currents on the power feed line 45 in the monitoring period $P_{811}$ set within the period $P_{1a}$ within each modulation cycle $P_1$ and the monitoring period $P_{812}$ set within the period $P_{1b}$ within each modulation cycle $P_1$ are also calculated.

In the second mode, as shown in FIG. 15, the average value VA1 of the voltages and the average value IA1 of the currents on the power feed line 43 in the monitoring period $P_{621}$ set within the period $P_{2a}$ within each modulation cycle $P_2$ and the monitoring period $P_{622}$ set within the period $P_{2b}$ within each modulation cycle $P_2$ are calculated. Further, in the second mode, the average value VA2 of the voltages and the average value IA2 of the currents on the power feed line 45 in the monitoring period $P_{82}$ set within the period $P_{2a}$ within each modulation cycle $P_2$ are also calculated.

In the third mode, as depicted in FIG. 16, the average value VA1 of the voltages and the average value IA1 of the currents on the power feed line 43 in the monitoring period $P_{631}$ set within the period $P_{2a}$ within each modulation cycle $P_2$ and the monitoring period $P_{632}$ set within the period $P_{2b}$ within each modulation cycle $P_2$ are calculated. Further, in the third mode, the average value VA2 of the voltages and the average value IA2 of the currents on the power feed line 45 in the monitoring period $P_{83}$ set within the period $P_{2a}$ within each modulation cycle $P_2$ are also calculated.

In the sixth mode, as illustrated in FIG. 19, the average value VA1 of the voltages and the average value IA1 of the currents on the power feed line 43 in the monitoring period $P_{661}$ set within the period $P_{22a}$ within each modulation cycle $P_{22}$ and the monitoring period $P_{662}$ set within the period $P_{22b}$ within each modulation cycle $P_{22}$ are calculated. Further, the average value VA1 may be calculated from the average values of the voltages on the power feed line 43 in the monitoring periods $P_{663}$ set within both of the monitoring period $P_{661}$ and the monitoring period $P_{662}$, and the average value IA1 may be calculated from the average values of the currents on the power feed line 43 in the corresponding monitoring periods $P_{663}$. Further, in the sixth mode, the average value VA2 of the voltages and the average value IA2 of the currents on the power feed line 45 in the monitoring period $P_{86}$ set within the period $P_{22a}$ within each modulation cycle $P_{22}$ are calculated. Further, in case that the monitoring periods $P_{86}$ are set within the period $P_{22a}$ within each modulation cycle $P_{22}$, the average value VA2 may be calculated from the average values of the voltages on the power feed line 45 in the corresponding monitoring periods $P_{86}$, and the average value IA2 may be calculated from the average values of the currents on the power feed line 45 in the corresponding monitoring periods $P_{86}$.

In a subsequent process ST3, the first moving average value of the impedance at the load side of the high frequency power supply 36 is calculated from a preset number of the first average value groups, and the second moving average value of the impedance at the load side of the high frequency power supply 38 is calculated from a preset number of the second average value groups. Then, in a subsequent process ST4, the reactance of each of the variable reactance elements 40g and 40h of the matching device 40 is adjusted such that the impedance at the load side of the high frequency power supply 36 specified by the first moving average value approximates or equals to the matching point. Furthermore, the reactance of each of the variable reactance elements 42g and 42h of the matching device 42 is adjusted such that the impedance at the load side of the high frequency power supply 38 specified by the second moving average value approximates or equals to the matching point. The processes ST2 to ST4 are repeated until it is determined in a process ST5 that the usage of the high frequency power RF1 and the high frequency power RF2 is finished.

In case that the lowest modulation frequency is commonly used in the generation of both the high frequency power RF1 and the high frequency power RF2, an average value calculation by a second averaging processing is performed periodically in a process ST6. In the second averaging processing, an average value of the currents and an average value of the voltages on the power feed line 43 at multiple time points in one period (high-level period) between two periods within the modulation cycle of the high frequency power RF1 specified by the corresponding lowest modulation frequency are calculated, and an average value of the currents and an average value of the voltages on the power feed line 45 at multiple time points in one period (high-level period) between two periods within the modulation cycle of the high frequency power RF2 specified by the corresponding lowest modulation frequency are also calculated. Accordingly, the first average value group (the average value VA1 and the average value IA1) and the second average value group (the average value VA2 and the average value IA2) are obtained.

To elaborate, in the fourth mode, as shown in FIG. 17, the average value VA1 of the voltages and the average value IA1 of the currents on the power feed line 43 in the monitoring period $P_{64}$ set within the period $P_{1a}$ within each modulation cycle $P_1$ are calculated. Further, in the fourth mode, the average value VA2 of the voltages and the average value IA2 of the currents on the power feed line 45 in the monitoring period $P_{84}$ set within the period $P_{2a}$ within each modulation cycle $P_2$ are also calculated.

In the fifth mode, as shown in FIG. 18, the average value VA1 of the voltages and the average value IA1 of the currents on the power feed line 43 in the monitoring period $P_{65}$ set within the period $P_{1a}$ within each modulation cycle $P_1$ are calculated. Further, in the fifth mode, the average value VA2 of the voltages and the average value IA2 of the currents on the power feed line 45 in the monitoring period $P_{85}$ set within the period $P_{2a}$ within each modulation cycle $P_2$ are also calculated.

In the seventh mode, as illustrated in FIG. 20, the average value VA1 of the voltages and the average value IA1 of the currents on the power feed line 43 in the monitoring period $P_{67}$ set within the period $P_{12a}$ within each modulation cycle $P_{12}$ are calculated. Further, the average value VA1 may be calculated from the average values of the voltages on the power feed line 43 in the monitoring periods $P_{671}$ set within the monitoring period $P_{67}$, and the average value IA1 may be calculated from the average values of the currents on the power feed line 43 in the corresponding monitoring periods $P_{671}$. Further, in the seventh mode, the average value VA2 of the voltages and the average value IA2 of the currents on the power feed line 45 in the monitoring period $P_{87}$ set within the period $P_{2a}$ within each modulation cycle $P_2$ are calculated.

In a subsequent process ST7, as in the process ST3, the first moving average value of the impedance at the load side of the high frequency power supply 36 is calculated from a preset number of the first average value groups, and the second moving average value of the impedance at the load side of the high frequency power supply 38 is calculated from a preset number of the second average value groups. Then, in a following process ST8, as in the process ST4, the reactance of each of the variable reactance elements 40g and 40h of the matching device 40 is adjusted such that the impedance at the load side of the high frequency power supply 36 specified by the first moving average value approximates or equals to the matching point. Furthermore, the reactance of each of the variable reactance elements 42g and 42h of the matching device 42 is adjusted such that the impedance at the load side of the high frequency power supply 38 specified by the second moving average value approximates or equals to the matching point. The processes ST6 to ST8 are repeated until it is determined in a process ST9 that the usage of the high frequency power RF1 and the high frequency power RF2 is finished.

In the method MT, as stated above, one of the two averaging processings which select different monitoring periods for the calculation of the first average value group and the second average value group is selectively performed depending on whether or not the lowest modulation frequency used in the generation of the high frequency power RF1 and the high frequency power RF2 is commonly used in the generation of both the high frequency power RF1 and the high frequency power RF2. That is, the first average value group and the second average value group are calculated only by the two averaging processings on the various combinations of the modulation of the high frequency power RF1 and the high frequency power RF2. Therefore, a relatively simple calculation of the impedance for the matching operations of the matching devices 40 and 42 can be achieved.

Further, if the average value VA1 and the average value IA1 are calculated from the average values of the voltages and the average values of the currents on the power feed line 43 in the monitoring periods $P_{663}$, the average value of the voltages and the average value of the currents on the first power feed line, which are obtained from the first average value group (the average value VA1 and the average value IA1), can be calculated with higher accuracy.

Further, if the average value VA1 and the average value IA1 are calculated from the average values of the voltages and the average values of the currents on the power feed line 43 in the monitoring periods $P_{671}$, the average value of the voltages and the average value of the currents on the first power feed line, which are obtained from the first average value group (the average value VA1 and the average value IA1), can be calculated with higher accuracy.

Furthermore, in the above-described exemplary embodiment, the first average value group including the average value VA1 of the voltages and the average value IA1 of the currents and the second average value group including the average value VA2 of the voltages and the average value IA2 of the currents are used. However, the average value of the impedance at the load side of the high frequency power supply 36 in the above-described monitoring period(s) in each of the first to seventh modes may be calculated as a first average value, and the average value of the impedance at the load side of the high frequency power supply 38 in the above-described monitoring period(s) in each of the first to seventh modes may be calculated as a second average value. Further, the first moving average value may be calculated from a preset number of the first average values, and the second moving average value may be calculated from a preset number of the second average values.

In case of using the first average value and the second average value, the impedance sensor 40b is equipped with an impedance calculator configured to calculate the impedance at the load side of the high frequency power supply 36 from the filtered voltage waveform signal output from the filter 106A and the filtered current waveform signal output from the filter 108A; an average value calculator configured to calculate the average value (first average value) of the impedance output from the impedance calculator in the monitoring period; and a moving average value calculator configured to calculate the moving average value (first moving average value) from a preset number of the average values (first average values) output from the average value calculator. Further, the impedance sensor 42b is equipped with an impedance calculator configured to calculate the impedance at the load side of the high frequency power supply 38 from the filtered voltage waveform signal output from the filter 106B and the filtered current waveform signal output from the filter 108B; an average value calculator configured to calculate the average value (second average value) of the impedance output from the impedance calculator in the monitoring period; and a moving average value calculator configured to calculate the moving average value (second moving average value) from a preset number of the average values (second average values) output from the average value calculator.

Figure 21:
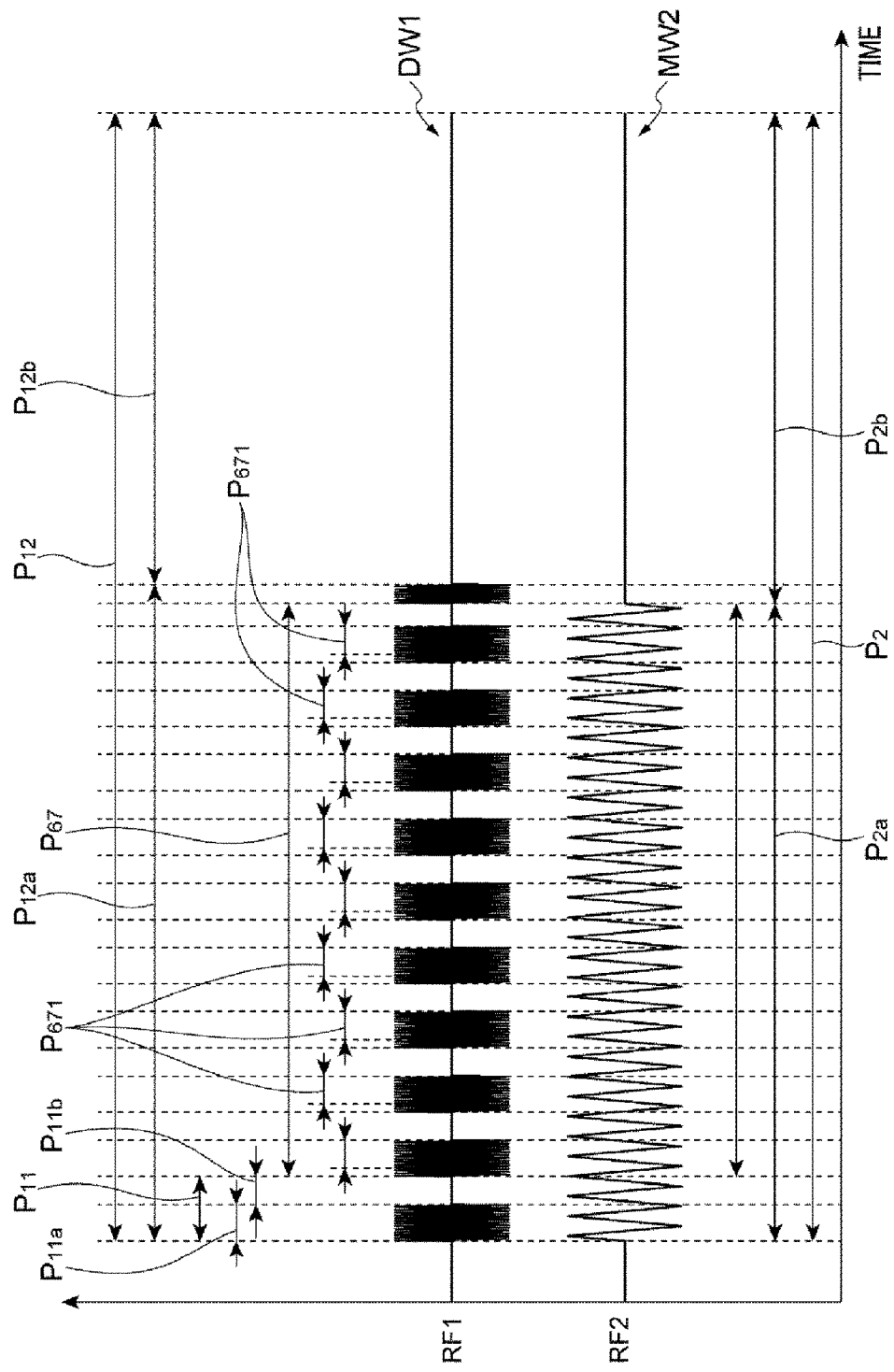
FIG. 21 is a diagram illustrating a modification example of the first high frequency power and the second high frequency power in the seventh mode.

Now, reference is made to FIG. 21. FIG. 21 is a diagram illustrating a modification example of the first high frequency power and the second high frequency power in the seventh mode. Even if the modulation cycle of the high frequency power RF1 and the modulation cycle of the high frequency power RF2 are synchronized, a duty ratio occupied by the high-level period in the modulation cycle of the high frequency power RF1 and a duty ratio occupied by the high-level period in the modulation cycle of the high frequency power RF2 may be different. In such a case, an end point of the high-level period within the modulation cycle of the high frequency power RF1 and an end point of the high-level period within the modulation cycle of the high frequency power RF2 are different. By way of example, in the seventh mode, though the second modulation frequency $f_{D12}$ of the high frequency power RF1 (double-modulated wave DW1) and the modulation frequency $f_{M2}$ of the high frequency power RF2 (modulated wave MW2) are same and the modulation cycle $P_{12}$ of the high frequency power RF1 and the modulation cycle $P_2$ of the high frequency power RF2 are synchronized, the end point of the period $P_{12a}$ within the modulation cycle $P_{12}$ and the end point of the period $P_{2a}$ within the modulation cycle $P_2$ do not coincide with each other, as can be seen from FIG. 21. In such a state shown of FIG. 21, the monitoring period $P_{67}$ is set within a period during which the period $P_{12a}$ and the period $P_{2a}$ corresponding thereto are overlapped. That is, the first average value or the first average value group in the period during which the period $P_{12a}$ and the period $P_{2a}$ are overlapped is calculated. Further, without being limited to the seventh mode, if the modulation cycle of the high frequency power RF1 and the modulation cycle of the high frequency power RF2 are synchronized with each other and the end point of the high-level period within the corresponding modulation cycle of the high frequency power RF1 and the end point of the high-level period within the corresponding modulation cycle of the high frequency power RF2 are different, the monitoring period may be set within the period during which the high-level period within the corresponding modulation cycle of the high frequency power RF1 and the high-level period within the corresponding modulation cycle of the high frequency power RF2 are overlapped.

Figure 22:
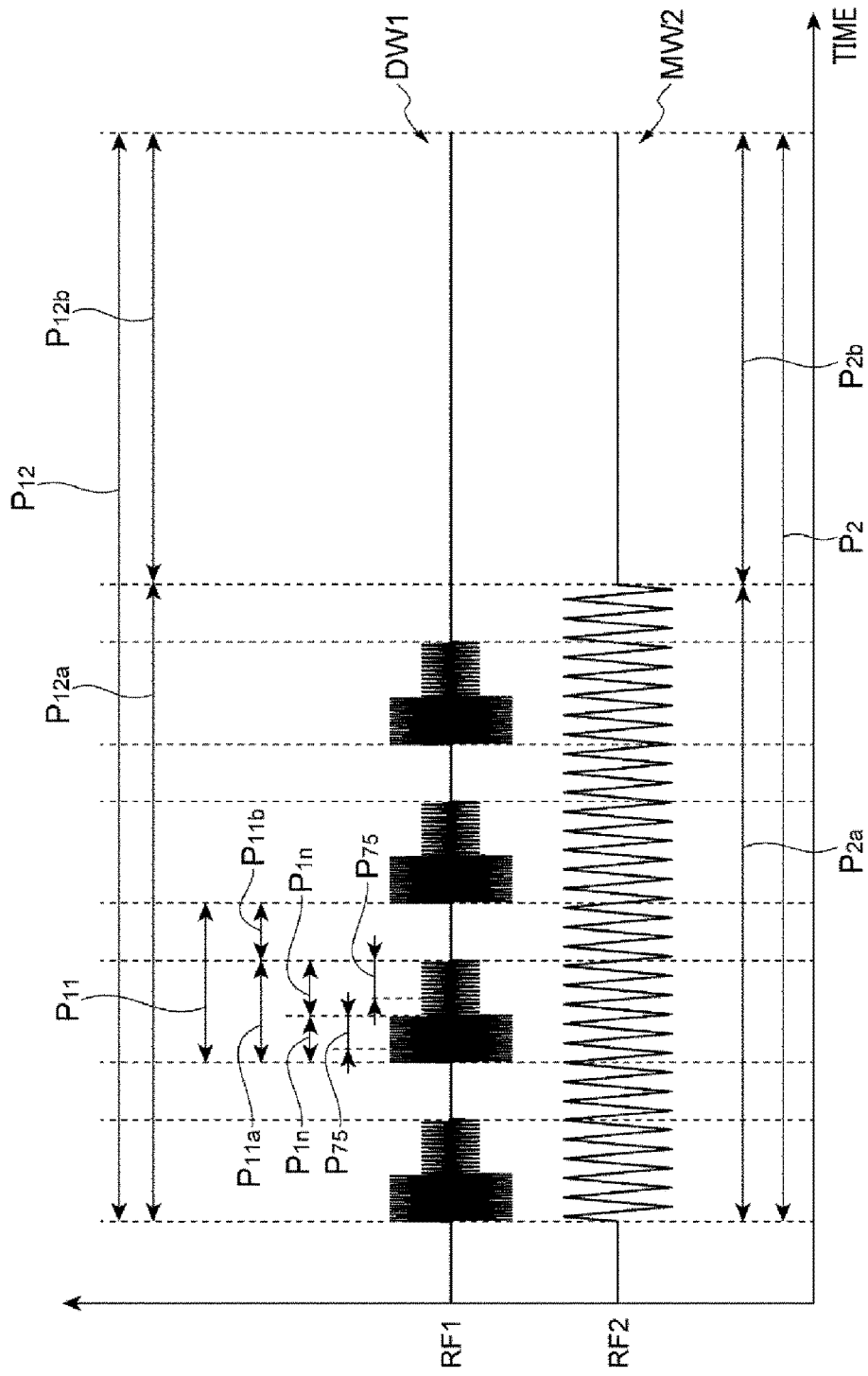
FIG. 22 is a diagram illustrating another modification example of the first high frequency power and the second high frequency power in the seventh mode.

Now, reference is made to FIG. 22. FIG. 22 is a diagram illustrating another modification example of the first high frequency power and the second high frequency power in the seventh mode. In the high frequency power RF1 (double-modulated wave DW1) shown in FIG. 22, the level (power) of the high frequency power RF1 is different in each of multiple periods $P_{1n}$ set within the period $P_{11a}$. In such a state of FIG. 22, the first average value group (the average value VA1 and the average value IA1) may be calculated from multiple average values of the voltages and multiple average values of the currents on the power feed line 43 in multiple monitoring periods $P_{75}$ set within each of the periods $P_{1n}$. Alternatively, the first average value may be calculated from multiple average values of the impedance at the load side of the high frequency power supply 36 in the monitoring periods $P_{75}$. As stated above, the high frequency power RF1 having different levels in respective multiple periods set within the high-level period may be used. Furthermore, the first average value group may be calculated from the average values of the voltages and the average values of the currents on the power feed line 43 in the monitoring periods set within the corresponding multiple periods within the high-level period, or the first average value may be calculated from the average values of the impedance at the load side of the high frequency power supply 36 in the monitoring periods. In such a case, the impedance at the load side of the high frequency power supply 36 obtained from the first average value, or the voltage and the current on the power feed line 43 obtained from the first average value group can be calculated with higher accuracy.

In the above, the various exemplary embodiments have been described. However, the exemplary embodiments are not limiting, and various changes and modifications may be made. By way of example, the high frequency power supply 36 may be connected to the upper electrode 46 via the matching device 40.

Further, the moving average values VMA1, IMA1, VMA2 and IMA2, the first moving average value obtained from the preset number of the average values of the impedance at the load side of the high frequency power supply 36 and the second moving average value obtained from the preset number of the average values of the impedance at the load side of the high frequency power supply 38 may be calculated by any of various moving average value calculation methods such as a simple moving average method, a weighted moving average method and an exponential moving average method. Furthermore, in case that each of the matching circuits of the matching devices 40 and 42 is capable of performing high-speed matching operation, there may be employed the index moving average method or the weighted moving average method of applying a maximum weight to a most recently obtained average value among a preset number of the average values used in the calculation of the moving average value. As an example of such a matching circuit capable of realizing the high-speed matching operation, there may be used a matching circuit configured to vary the number of capacitors functioning in the matching circuit among multiple capacitors by a switching device (for example, a field effect device).

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

We claim:

1. A method for impedance matching of a plasma processing apparatus,
wherein the plasma processing apparatus comprises:
a chamber main body;
a first electrode and a second electrode which are arranged such that a space within the chamber main body is provided therebetween;
a first high frequency power supply configured to output a first high frequency power for plasma generation, the first high frequency power having a first basic frequency;
a second high frequency power supply configured to output a second high frequency power for ion attraction, the second high frequency power having a second basic frequency lower than the first basic frequency;
a first power feed line configured to electrically connect the first electrode or the second electrode to the first high frequency power supply;
a second power feed line configured to electrically connect the second electrode to the second high frequency power supply;
a first matching device configured to adjust an impedance at a load side of the first high frequency power supply; and
a second matching device configured to adjust an impedance at a load side of the second high frequency power supply,
wherein the first high frequency power supply is configured to selectively output, as the first high frequency power, one of:
a first continuous wave having the first basic frequency;
a first modulated wave generated by modulating a level of a continuous wave having the first basic frequency through a first modulation in which a level of a continuous wave is modulated such that a level in one period between two periods alternately repeated at a modulation frequency is set to be higher than a level in the other period between the two periods; and
a first double-modulated wave generated by modulating a level of a continuous wave having the first basic frequency through a second modulation in which a level of a continuous wave is modulated such that a level in a period during which one period between two periods alternately repeated at a first modulation frequency and one period between two periods alternately repeated at a second modulation frequency lower than the first modulation frequency are overlapped is set to be higher than levels in the other period between the two periods alternately repeated at the first modulation frequency and the other period between the two periods alternately repeated at the second modulation frequency,
wherein the second high frequency power supply is configured to selectively output, as the second high frequency power, one of:
a second continuous wave having the second basic frequency;
a second modulated wave generated by modulating a level of a continuous wave having the second basic frequency through the first modulation; and
a second double-modulated wave generated by modulating a level of a continuous wave having the second basic frequency through the second modulation,
wherein the method comprises:
performing an averaging processing in which a first average value of the impedance at the load side of the first high frequency power supply or a first average value group including an average value of voltages and an average value of currents on the first power feed line is calculated, and a second average value of the impedance at the load side of the second high frequency power supply or a second average value group including an average value of voltages and an average value of currents on the second power feed line is calculated;
calculating a first moving average value and a second moving average value, the first moving average value being a moving average value of the impedance at the load side of the first high frequency power supply and being calculated from a preset number of the first average values or a preset number of the first average value groups obtained by the performing of the averaging processing, and the second moving average value being a moving average value of the impedance at the load side of the second high frequency power supply and being calculated from a preset number of the second average values or a preset number of the second average value groups obtained by the performing of the averaging processing; and
adjusting a variable reactance element of the first matching device and a variable reactance element of the second matching device such that the first moving average value and the second moving average value respectively approximate to matching points,
wherein, in the performing of the averaging processing,
if a lowest modulation frequency used in generation of the first high frequency power and the second high frequency power is used only in the generation of the high frequency power output from one of the first high frequency power supply and the second high frequency power supply,
the first average value and the second average value are obtained by calculating an average value of the impedance at the load side of the one high frequency power supply at multiple time points in the one period between the two periods alternately repeated at the lowest modulation frequency and, also, by calculating an average value of the impedance at the load side of the other high frequency power supply at multiple time points in both of the two periods alternately repeated at the lowest modulation frequency, or
the first average value group and the second average value group are obtained by calculating an average value of the currents and an average value of the voltages on one power feed line used for transmission of the high frequency power from the one high frequency power supply between the first power feed line and the second power feed line at multiple time points in the one period between the two periods alternately repeated at the lowest modulation frequency and, also, by calculating an average value of the currents and an average value of the voltages on the other power feed line at multiple time points in both of the two periods alternately repeated at the lowest modulation frequency, and
if the lowest modulation frequency used in the generation of the first high frequency power and the second high frequency power is commonly used in the generation of both the first high frequency power and the second high frequency power,
the first average value is calculated from the impedance at the load side of the first high frequency power supply at multiple time points in the one period between the two periods within a modulation cycle of the first high frequency power defined by the lowest modulation frequency, and the second average value is calculated from the impedance at the load side of the second high frequency power supply at multiple time points in the one period between the two periods within a modulation cycle of the second high frequency power defined by the lowest modulation frequency, or the first average value group is calculated from the voltage and the current on the first power feed line at multiple times points in the one period between the two periods within the modulation cycle of the first high frequency power defined by the lowest modulation frequency, and the second average value group is calculated from the voltage and the current on the second power feed line at multiple time points in the one period between the two periods within the modulation cycle of the second high frequency power defined by the lowest modulation frequency.

2. The method of claim 1, wherein if the first high frequency power supply outputs the first modulated wave; the second high frequency power supply outputs the second double-modulated wave; and the modulation frequency used in generation of the first modulated wave and the first modulation frequency used in generation of the second double-modulated wave are same, the first average value is calculated from the average values of the impedance at the load side of the first high frequency power supply in the modulation cycles, each of which is defined by the modulation frequency used in the generation of the first modulated wave, within the modulation cycle defined by the second modulation frequency used in the generation of the second double-modulated wave, or the first average value group is calculated from average values of the currents and average values of the voltages on the first power feed line in the modulation cycles.

3. The method of claim 1, wherein if the first high frequency power supply outputs the first double-modulated wave; the second high frequency power supply outputs the second modulated wave which is synchronized with the first double-modulated wave; and the second modulation frequency used in the generation of the first double-modulated wave is the same as the modulation frequency used in the generation of the second modulated wave, the first average value is calculated from average values of the impedance at the load side of the first high frequency power supply in the modulation cycles, each of which is defined by the first modulation frequency used in the generation of the first double-modulated wave, within the modulation cycle defined by the second modulation frequency used in the generation of the first double-modulated wave, or the first average value group is calculated from the average values of the currents and the average values of the voltages on the first power feed line in the modulation cycles.

4. The method of claim 1, wherein if the first high frequency power supply outputs the first double-modulated wave; the second high frequency power supply outputs the second modulated wave which is synchronized with the first double-modulated wave; and the second modulation frequency used in the generation of the first double-modulated wave is the same as the modulation frequency used in the generation of the second modulated wave, the first average value is calculated from the impedance at the load side of the first high frequency power supply in a period during which the one period between the two periods within the modulation cycle defined by the second modulation frequency used in the generation of the first double-modulated wave and the one period between the two periods within the corresponding modulation cycle defined by the modulation frequency used in the generation of the second modulated wave are overlapped, or the first average value group is calculated from the voltage and the current on the first power feed line in the period during which the one period between the two periods within the modulation cycle defined by the second modulation frequency used in the generation of the first double-modulated wave and the one period between the two periods within the corresponding modulation cycle defined by the modulation frequency used in the generation of the second modulated wave are overlapped.

5. The method of claim 1, wherein the first high frequency power is modulated to have different levels in different periods within the one period between the two periods alternately repeated at the modulation frequency used in the first modulation or within the one period between the two periods alternately repeated at the first modulation frequency used in the second modulation, and the first average value is calculated from the average values of the impedance at the load side of the first high frequency power supply in the different periods, or the first average value group is calculated from the average values of the voltages and the average values of the currents on the first power feed line in the different periods.

* * * * *